(12) United States Patent
Chen

(10) Patent No.: US 12,446,425 B2
(45) Date of Patent: Oct. 14, 2025

(54) DISPLAY PANEL INCLUDING PLURALITY OF DUMMY WIRES AND DISPLAY DEVICE HAVING THE SAME

(71) Applicant: Xiamen Tianma Display Technology Co., Ltd., Xiamen (CN)

(72) Inventor: Guoxing Chen, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 466 days.

(21) Appl. No.: 17/949,542

(22) Filed: Sep. 21, 2022

(65) Prior Publication Data
US 2023/0015666 A1    Jan. 19, 2023

(30) Foreign Application Priority Data
Jun. 30, 2022   (CN) ......................... 202210771375.2

(51) Int. Cl.
| | |
|---|---|
| *H10K 59/12* | (2023.01) |
| *H10D 86/40* | (2025.01) |
| *H10D 86/60* | (2025.01) |
| *H10K 59/121* | (2023.01) |
| *H10K 59/131* | (2023.01) |

(52) U.S. Cl.
CPC ....... *H10K 59/1315* (2023.02); *H10D 86/441* (2025.01); *H10D 86/60* (2025.01); *H10K 59/1213* (2023.02); *H10K 59/1216* (2023.02)

(58) Field of Classification Search
CPC ........... H10K 59/1315; H10K 59/1213; H10K 59/1216; H10D 86/441; H10D 86/60
USPC ........................................................ 257/500
See application file for complete search history.

(56) References Cited

U.S. PATENT DOCUMENTS

2014/0098495 A1*   4/2014   Jeon ................... H05K 7/20136
361/695

FOREIGN PATENT DOCUMENTS

| CN | 113327972 A | * | 8/2021 | ........... G09G 3/3225 |
| CN | 113363281 A | * | 9/2021 | ......... G02F 1/13306 |
| CN | 114003143 A | | 2/2022 | |

OTHER PUBLICATIONS

Cite the machine translation Lin J (CN-113363281-A).*
Cite the machine translation Yue Q (CN-113327972-A).*

* cited by examiner

*Primary Examiner* — Phuc T Dang
(74) *Attorney, Agent, or Firm* — KDW FIRM PLLC

(57) ABSTRACT

Provided are a display panel and a display device. The display panel includes a display region, a non-display region at least partially surrounding the display region, and a fan-out region. The display region includes a plurality of scanning lines extending along a first direction and a plurality of data lines extending along a second direction, where the first direction intersects with the second direction. The non-display region includes a plurality of pads. The fan-out region is configured on one side of the display region closer to the plurality of pads, where at least part of the fan-out region is disposed in the display region. The fan-out region is provided with a plurality of fan-out wires for connecting the plurality of data lines to the corresponding pads.

21 Claims, 13 Drawing Sheets

DISPLAY PANEL INCLUDING PLURALITY OF DUMMY WIRES AND DISPLAY DEVICE HAVING THE SAME

CROSS-REFERENCE TO RELATED APPLICATION(S)

This application claims priority to Chinese Patent Application No. 202210771375.2 filed Jun. 30, 2022, the disclosure of which is incorporated herein by reference in its entirety.

TECHNICAL FIELD

The present disclosure relates to the field of display technologies and, in particular, to a display panel and a display device.

BACKGROUND

Existing display panels tend to be configured with a lighter and thinner design, such as liquid crystal display panels or organic light-emitting display panels. Compared with the liquid crystal display panels, the organic light-emitting display panels are lighter and thinner, have a better viewing angle and contrast, and thus the organic light-emitting display panels attract much attention.

The organic light-emitting display panel includes a display region and a non-display region. A pad receiving multiple signals for displaying an image from an external device may be provided in the non-display region. Multiple fan-out wires that transmit signals may be provided in the non-display region or in the display region. The fan-out wires are provided in the display region, which is conducive to achieving the narrow-frame design of a display screen, thereby improving the viewing experience of the user. However, the fan-out wiring causes uneven light emission of the display panel, and spots are easily generated in the display region.

SUMMARY

Embodiments of the present disclosure provide a display panel and a display device so as to effectively improve the display uniformity of the display panel.

In a first aspect, an embodiment of the present disclosure provides a display panel. The display panel includes a display region, a non-display region at least partially surrounding the display region, and a fan-out region.

The display region includes a plurality of scanning lines extending along a first direction and a plurality of data lines extending along a second direction, where the first direction intersects with the second direction, and the plurality of scanning lines and the plurality of data lines intersect to define sub-pixel regions; and the non-display region includes a plurality of pads.

The fan-out region is configured on one side of the display region closer to the plurality of pads, where at least part of the fan-out region is disposed in the display region.

The fan-out region is provided with a plurality of fan-out wires for connecting the plurality of data lines to the corresponding pads; and the display region includes a plurality of dummy wires, where the plurality of dummy wires include first dummy wires extending along the first direction and second dummy wires extending along the second direction.

On a plane parallel to the substrate, projections of the plurality of dummy wires form a grid structure, and the plurality of fan-out wires are insulated from the plurality of dummy wires.

In a second aspect, a display device is provided in an embodiment of the present disclosure and includes any display panel described in the first aspect.

The present disclosure provides a display panel. The display panel includes a display region, a non-display region at least partially surrounding the display region, and a fan-out region. The display region includes a plurality of scanning lines extending along a first direction and a plurality of data lines extending along a second direction, where the first direction intersects with the second direction. The plurality of scanning lines and the plurality of data lines intersect to define sub-pixel regions. The non-display region includes a plurality of pads. The fan-out region is configured on one side of the display region closer to the plurality of pads, where at least part of the fan-out region is disposed in the display region. The fan-out region is provided with a plurality of fan-out wires for connecting the plurality of data lines to the corresponding pads and transmitting data signals outputted by the pads to the data lines, so as to reduce a distance between the fan-out region and the data lines. The display region includes dummy wires insulated from the fan-out wires, where the dummy wires includes first dummy wires extending along the first direction and second dummy wires extending along the second direction. On a plane parallel to the substrate, projections of the dummy wires form a grid structure. In this embodiment, the dummy wires whose projections form the grid structure are provided so that the light emission of the sub-pixel regions in the display region is more uniform, thereby effectively improving the display uniformity of the display panel.

DETAILED DESCRIPTION

Figure 1:
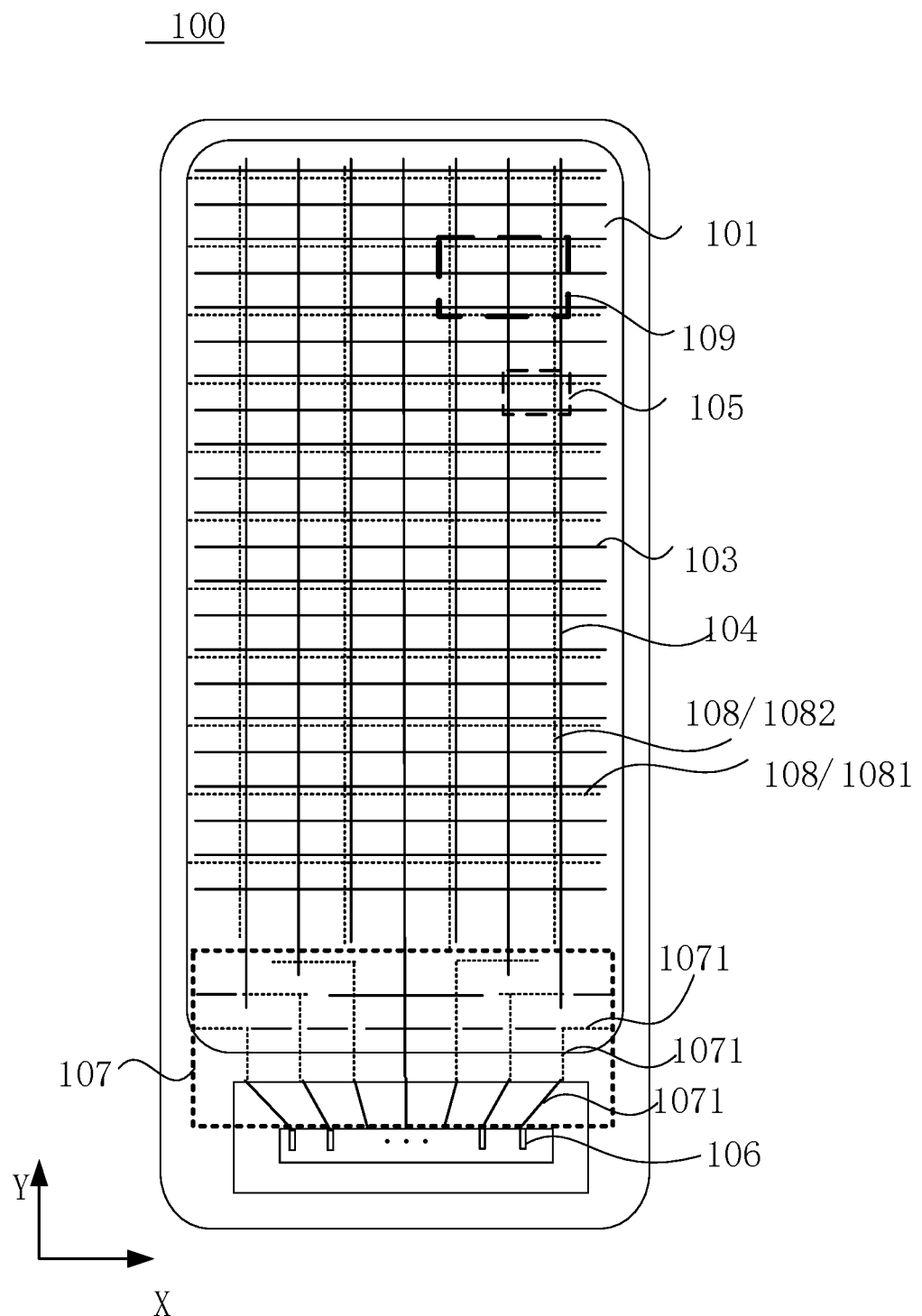
FIG. 1 is a structural diagram of a display panel according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

FIG. 1 is a structural diagram of a display panel according to an embodiment of the present disclosure. As shown in FIG. 1, a display panel 100 includes a substrate (not shown in FIG. 1), a display region 101, a non-display region 102 at least partially surrounding the display region 101, and a fan-out region 107. The display region 101 includes multiple scanning lines 103 extending along a first direction (X direction in the figure) and multiple data lines 104 extending along a second direction (Y direction in the figure). The second direction Y intersects with the first direction X. The scanning lines 103 and the data lines 104 intersect to define sub-pixel regions 105. The non-display region 102 includes multiple pads 106. The fan-out region 107 is configured on one side of the display region 101 closer to the pads 106. At least part of the fan-out region 107 is disposed in the display region 101. The fan-out region 107 is provided with multiple fan-out wires 1071 for connecting the data lines 104 to the corresponding pads 106. It may be understood that the fan-out wires are used for transmitting data signals. The display region 101 includes multiple dummy wires 108. The dummy wires 108 include first dummy wires 1081 extending along the first direction X and second dummy wires 1082 extending along the second direction Y. On a plane parallel to the substrate, projections of the dummy wires 108 form a grid structure 109. The fan-out wires 1071 are insulated from the dummy wires 108.

It is to be noted that the case where at least part of the fan-out region 107 is disposed in the display region 101 may be understood as part of the fan-out wires 1071 are located in the display region 101.

The display panel 100 includes the substrate (not shown in FIG. 1) and a driver circuit layer, a light-emitting layer and the like configured in sequence on the substrate. On the plane of the display panel 100 parallel to the substrate, the display panel 100 includes the display region 101, the non-display region 102 surrounding the display region 101, and the fan-out region 107. In this embodiment, to effectively save an area occupied by the fan-out region 107 in the non-display region 102, part of the fan-out region 107 is disposed in the display region 101. That is, in this embodiment, part of the fan-out region 107 is disposed in the display region 101 and part of the fan-out region 107 is disposed in the non-display region 102, so as to further reduce a setting area of the fan-out region 107, which is conducive to a narrow-frame design of the panel, thereby improving the full screen use experience of the user. The non-display region 102 includes multiple pads 106. The fan-out region 107 includes multiple fan-out wires 1071. An end of the fan-out wire 1071 is connected to the data line 104 in the display region 101, and the other end of the fan-out wire 1071 is connected to the pad 106. The pads 106 are used for binding driver chips or binding flexible circuit boards connected to the driver chips and then transmitting data signals outputted by the driver chips to the data lines 104 through the fan-out wires 1071. At the same time, part of the fan-out region 107 in the display panel 100 is located in the display region 101 so that the fan-out wires 1071 with relatively large bending angles connected to the data lines 104 at an edge of the display panel are not needed, thereby effectively reducing a space occupied by the fan-out wires 1071 in the non-display region 102. The display region 101 includes multiple scanning lines 103 extending along the first direction X and multiple data lines 104 extending along the second direction Y. The second direction Y intersects with the first direction X. Optionally, the first direction X is perpendicular to the second direction Y so that the scanning lines 103 and the data lines 104 are insulated and intersect to define multiple sub-pixel regions 105, where the sub-pixel regions 105 are used for achieving the image display of the display panel 100. The display region 101 further includes multiple dummy wires 108. The dummy wires 108 include the first dummy wires 1081 extending along the first direction X and the second dummy wires 1082 extending along the second direction Y. On the plane parallel to the substrate, the projections of the dummy wires form the grid structure 109. The fan-out wires 1071 are insulated from the dummy wires 108, that is, the fan-out wires 1071 and the dummy wires 108 are disconnected. The projections of the dummy wires 108 overlap with a metal wire shielding structure in the display panel 100, thereby avoiding the setting of the dummy wires 108 from reducing a normal display area of the display region 101. For example, the projections of the dummy wires 108 may at least partially overlap with projections of the data lines 104 or the scanning lines 103, thereby effectively increasing a light emission area of the sub-pixel regions 105 and preventing the dummy wires 108 from affecting the light emission of the sub-pixel regions 105. The fan-out region 107 includes the fan-out wires 1071 extending along the first direction X and along the second direction Y. As shown in FIG. 1, the same data line 104 is sequentially connected to the fan-out wire 1071 extending along the first direction X and the fan-out wire 1071 extending along the second direction Y, respectively, so that the data signals transmitted on the pads 106 are sequentially transmitted to the data lines 104 through the fan-out wires 1071. The fan-out wires 1071 are configured in different directions so that while a data signal transmission effect is ensured, the case where the fan-out wires 1071 connected to the corresponding data lines in an edge region need to have relatively large bending angles in the non-display region in the related art is avoided, and the pads 106 are connected to the data lines 104 in the edge region through multiple segments of fan-out wires 1071. For example, for a display panel with a relatively large size along the first direction X, 200 data lines 104 in the edge region may be connected to the pads 106 through multiple segments of fan-out wires 1071 in the display region, thereby effectively reducing an area occupied by the fan-out wires in the non-display region. In addition, although the fan-out wires 1071 in the fan-out region 107 in the display region 101 affect the light emission of the display panel to a certain extent, in this embodiment, a region other than the fan-out region 107 in the display region 101 is also provided with the dummy wires 108, and an effect of the dummy wires 108 on a light emission area of the display panel is the same as that of the fan-out wires 1071. Therefore, in this embodiment, a light emission effect in the entire display region 101 is uniform, thereby improving the display effect.

In the embodiment of the present disclosure, multiple fan-out wires and multiple dummy wires are disposed in the display panel, the dummy wires and part of the fan-out wires are disposed in the display region, and the dummy wires include the first dummy wires extending along the first direction and the second dummy wires extending along the second direction. On the plane parallel to the substrate, the projections of the dummy wires form the grid structure, the fan-out wires are insulated from the dummy wires, and the dummy wires extend in different directions so that the data signals transmitted through the pads is transmitted to the corresponding data lines. Then, the dummy wires whose projections form the grid structure are introduced, thereby effectively improving the display effect of the display panel.

Figure 2:
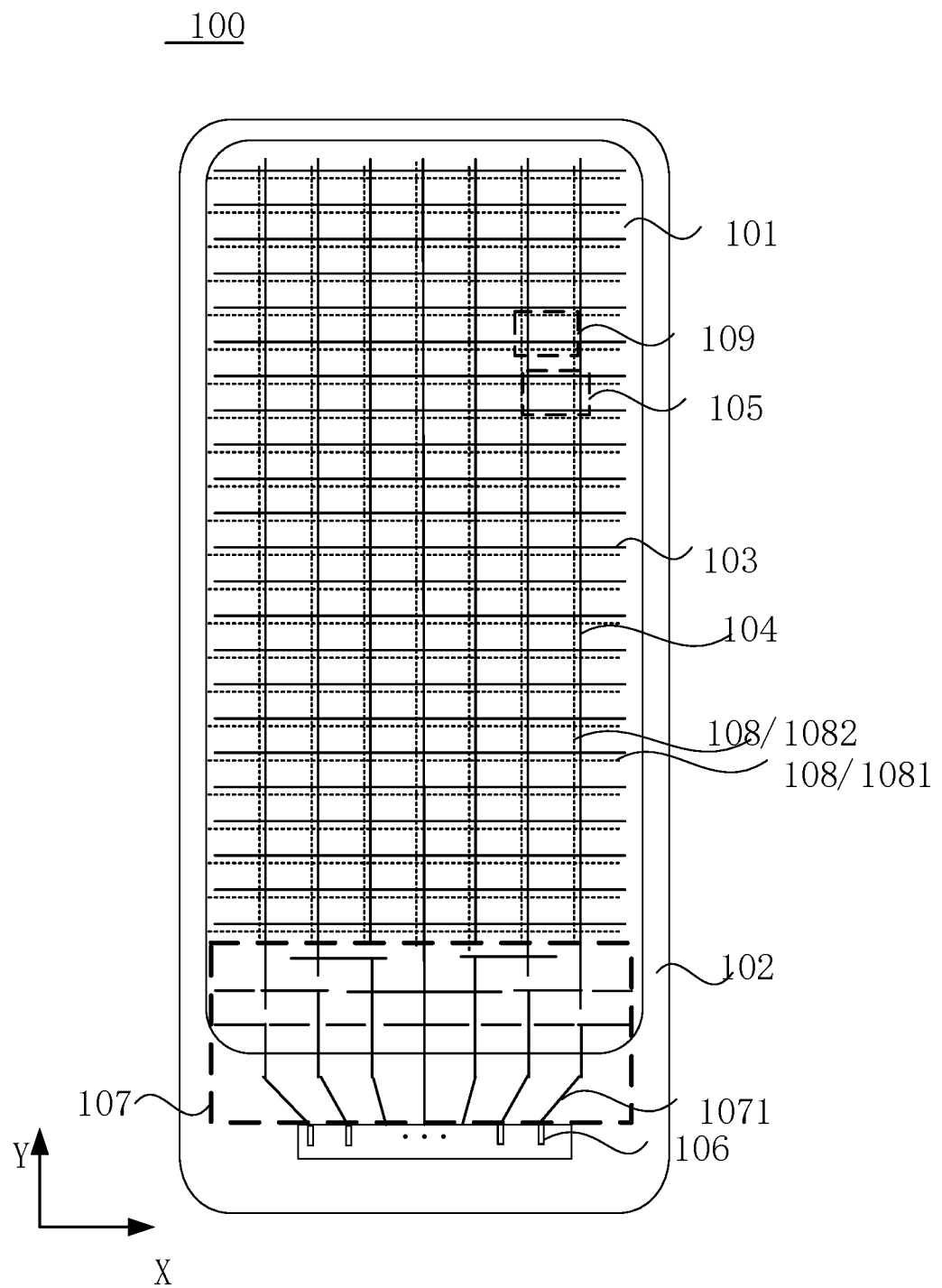
FIG. 2 is a structural diagram of another display panel according to an embodiment of the present disclosure.

Optionally, FIG. 2 is a structural diagram of another display panel according to an embodiment of the present disclosure. As shown in FIG. 2, each sub-pixel region 105 includes at least part of the first dummy wire 1081 and at least part of the second dummy wire 1082.

To ensure the overall display uniformity of the display panel 100, on the plane parallel to the substrate, the projections of the dummy wires 108 are uniformly configured in the entire display region 101 so that the first dummy wires 1081 extending along the first direction X and the second dummy wires 1082 extending along the second direction Y are configured in the entire display region 101, that is, each sub-pixel region 105 outside the fan-out region 107 in the display region 101 is provided with the first dummy wire 1081 and the second dummy wire 1082. Signals transmitted in the first dummy wire 1081 and the second dummy wire 1082 in the corresponding sub-pixel region 105 may be the same fixed signal or different fixed signals, and the specific signal types may be selected according to actual requirements, which is not specifically limited in the embodiments of the present disclosure. In this manner, signal coupling between the first dummy wire 1081 and the second dummy wire 1082 in a state of no signal transmission is avoided, and the display effect of the display panel 100 is avoided to be affected. It is to be noted that the fan-out region 107 in the display region 101 may include, in addition to the fan-out wires 1071, the dummy wires 108 insulated from the fan-out wires 1071 so that each sub-pixel region 105 in the fan-out region 107 is provided with the dummy wires 108 and/or the fan-out wires 1071, thereby further improving the uniformity of the display panel.

Figure 3:
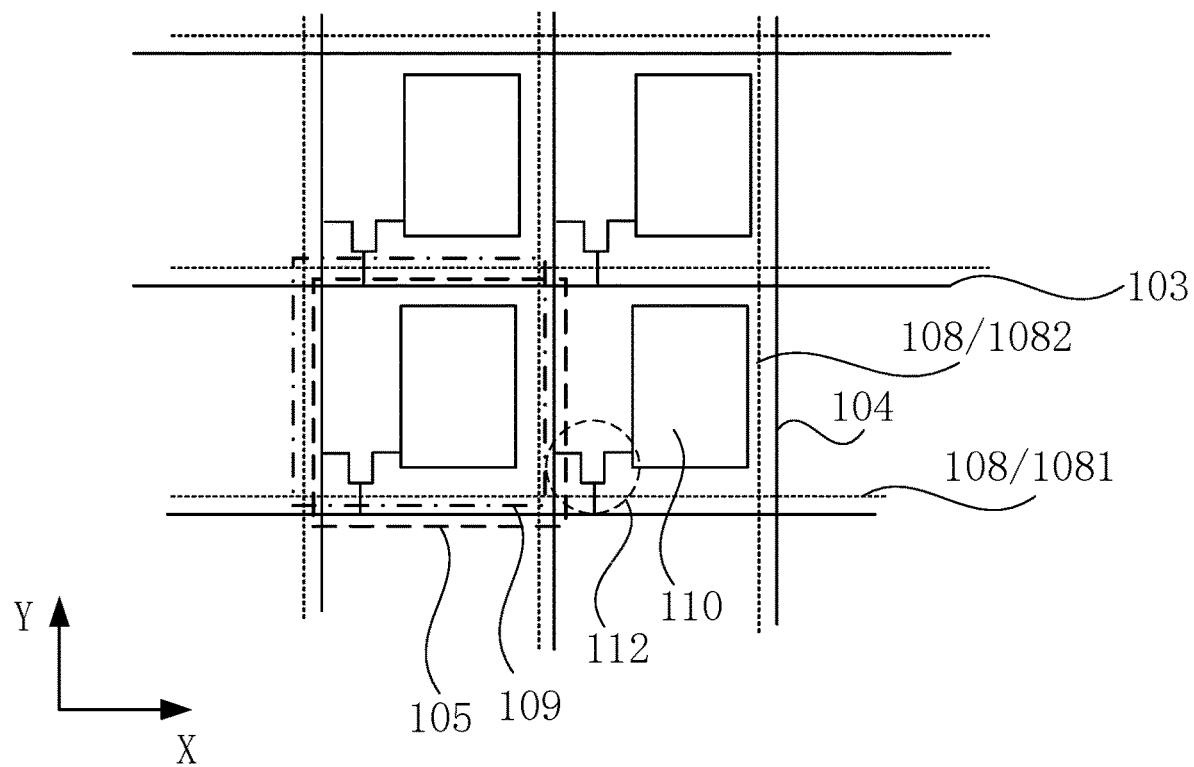
FIG. 3 is a partial structural diagram of the display panel of FIG. 2.

Optionally, FIG. 3 is a partial structural diagram of the display panel of FIG. 2. As shown in FIG. 3, the sub-pixel region 105 includes at least one light-emitting element 110, and on the plane parallel to a substrate 111, a projection of the light-emitting element 110 is located inside a mesh of the grid structure 109.

The sub-pixel region 105 includes at least one light-emitting element 110, and different sub-pixel regions 105 correspond to light-emitting elements 110 of different colors, so as to achieve the color display of the display panel 100. The first dummy wires 1081 extending along the first direction X and the second dummy wires 1082 extending along the second direction Y are configured in the display region 101, thereby ensuring the overall display uniformity of the display region 101. At the same time, on the plane parallel to the substrate 111, the projection of the light-emitting element 110 is located inside the mesh of the grid structure 109 so that the setting of the first dummy wires 1081 and the second dummy wires 1082 is avoided from blocking the light emission region of the light-emitting elements 110, thereby avoiding the display effect of the sub-pixel regions 105 from being affected. Optionally, the first dummy wires 1081 and the second dummy wires 1082 may at least partially overlap with other metal layers, thereby reducing the influence of the dummy wires 1081 on the light emission of the display panel.

Figure 4:
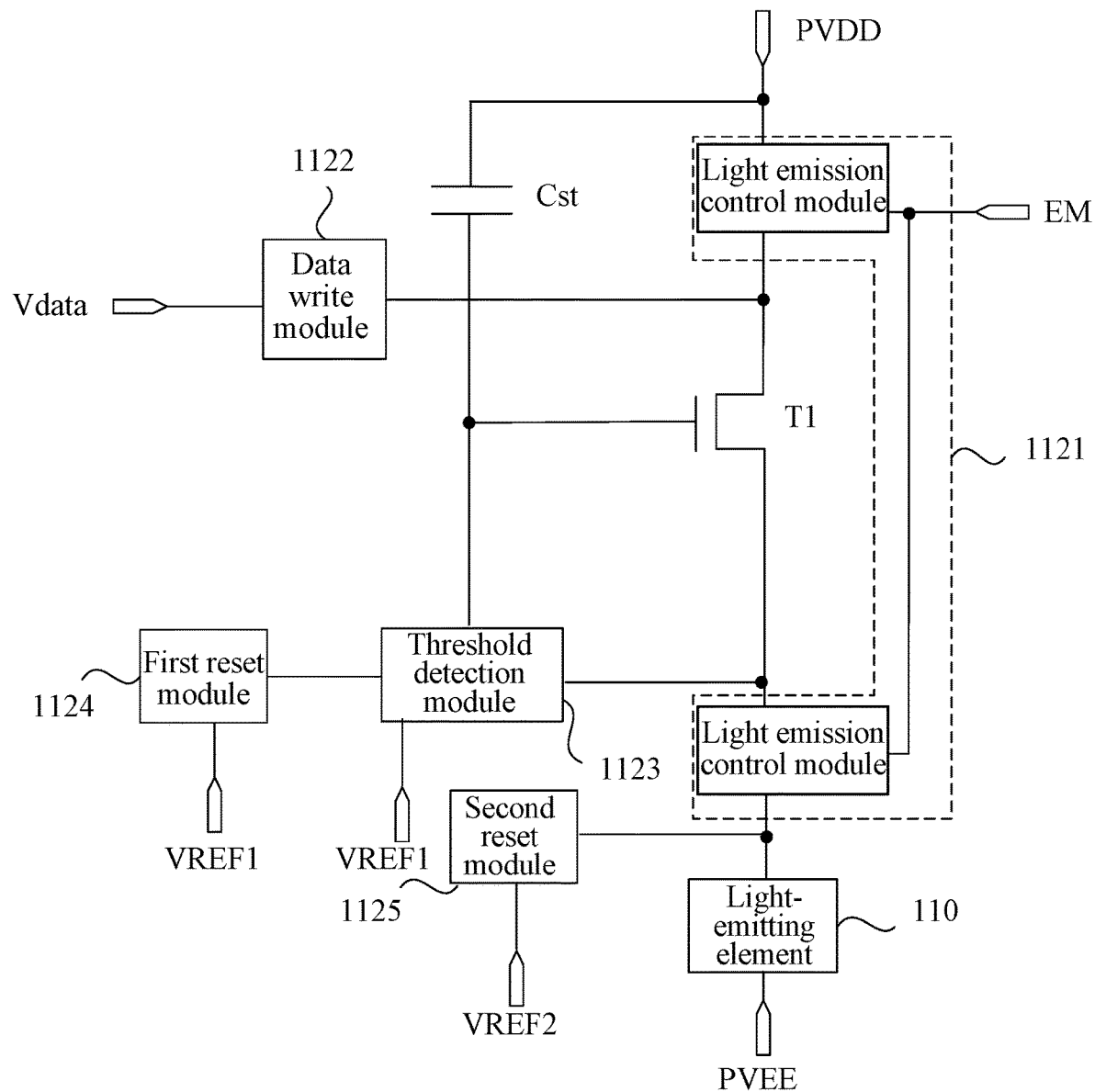
FIG. 4 is a structural diagram of a pixel driving circuit according to an embodiment of the present disclosure.
Figure 5:
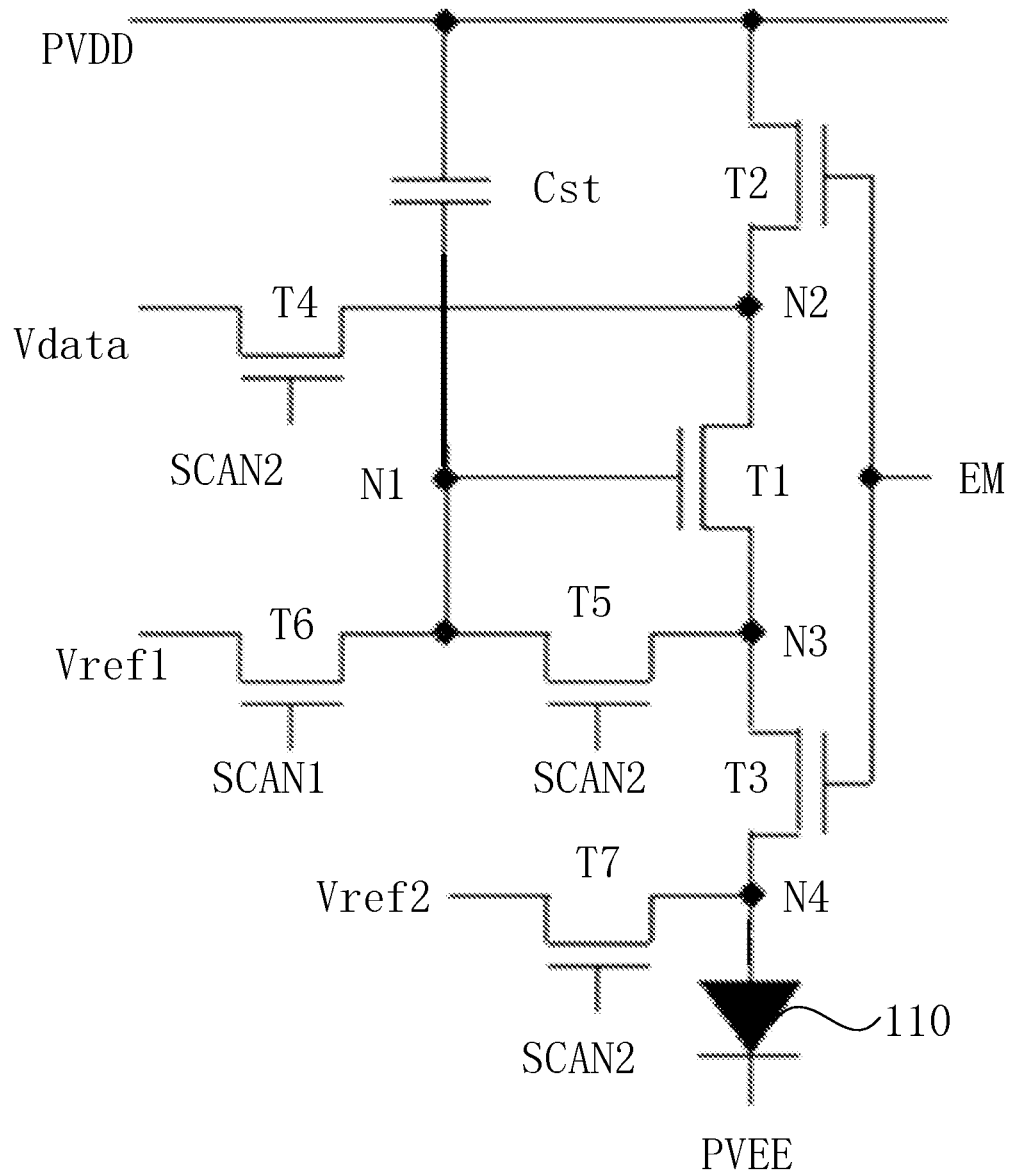
FIG. 5 is a diagram showing the circuit structure of a pixel driving circuit according to an embodiment of the present disclosure.

Optionally, FIG. 4 is a structural diagram of a pixel driving circuit according to an embodiment of the present disclosure, and FIG. 5 is a diagram showing the circuit structure of a pixel driving circuit according to an embodiment of the present disclosure. As shown in FIGS. 4 and 5, the sub-pixel region 105 further includes a pixel driving circuit 112. The pixel driving circuit 112 is electrically connected to a corresponding light-emitting element 110 and configured to provide an operating voltage for the light-emitting element 110. The pixel driving circuit is connected to at least one of the following: a first power signal output terminal PVDD, a second power signal output terminal PVEE, a first reference voltage signal output terminal VREF1, a second reference voltage signal output terminal VREF2, or a third power signal output terminal DVH. The dummy wires 108 are configured to receive at least one of the following signals: a first power signal pvdd, a second power signal pvee, a first reference voltage signal vref1, a second reference voltage signal vref2, or a third power signal dvh.

The sub-pixel region 105 further includes the pixel driving circuit 112. The pixel driving circuit 112 may be a 2T1C circuit, that is, a circuit with two thin-film transistors and one storage capacitor, or a 7T1C circuit, that is, a circuit in which seven thin-film transistors and one storage capacitor are configured, or an 8T1C circuit, that is, a circuit in which eight thin-film transistors and one storage capacitor are configured, or the like. The specific structure of the pixel driving circuit is not limited in the embodiments of the present disclosure. The pixel driving circuit 112 is electrically connected to the corresponding light-emitting element 110 and configured to provide the operating voltage for the light-emitting element 110, thereby ensuring normal display. The pixel driving circuit 112 is connected to at least one of the following: the first power signal output terminal PVDD, the second power signal output terminal PVEE, the first reference voltage signal output terminal VREF1, the second reference voltage signal output terminal VREF2, or the third power signal output terminal DVH. The first power signal output terminal PVDD is configured to output the first power signal pvdd. The second power signal output terminal PVEE is configured to output the second power signal pvee. The first power signal pvdd and the second power signal pvee are drive voltages for driving the light-emitting element 110. The first power signal pvdd may be a logic high-level signal, and the second power signal pvee may be a logic low-level signal. The first reference voltage signal output terminal VREF1 is configured to output the first reference voltage signal vref1, the second reference voltage signal output terminal VREF2 is configured to output the second reference voltage signal vref2, and the third power signal output terminal DVH is configured to output the third power signal dvh. In this manner, the leakage current in the pixel driving circuit 112 is improved. The dummy wires 108 are configured to receive at least one of the following signals: the first power signal pvdd, the second power signal pvee, the first reference voltage signal vref1, the second reference voltage signal vref2, or the third power signal dvh. Multiple dummy wires 108 are disposed in the display region 101, the dummy wires 108 may be configured to receive the same signal, or the dummy wires 108 may be configured to receive different signals, so as to reduce the current attenuation of different signals due to wire resistance, thereby effectively improving the display effect of the display panel 100.

Optionally, with continued reference to FIGS. 4 and 5, the display region 101 further includes multiple pixel driving circuits 112. The pixel driving circuits 112 are electrically connected to the corresponding light-emitting elements 110. The pixel driving circuit 112 includes a drive transistor T1, a light emission control module 1121, a data write module 1122, a threshold detection module 1123, a first reset module 1124, a second reset module 1125, and a storage capacitor Cst. The first reset module 1124 operates in response to a first scanning signal SCAN1 so as to connect a control terminal of the drive transistor T1 to the first reference voltage signal output terminal VREF1. The storage capacitor Cst is configured to connect the first power signal output terminal PVDD to the control terminal of the drive transistor T1. The data write module 1122 is configured to operate in response to a second scanning signal SCAN2 so as to connect a first terminal of the drive transistor T1 to the corresponding data line 104. The threshold detection module 1123 is configured to operate in response to the second scanning signal SCAN2 so as to connect the control terminal of the drive transistor to a second terminal of the drive transistor. The light emission control module 1121 is configured to operate in response to a light emission control signal and configured to connect the first terminal of the drive transistor T1 to the first power signal output terminal PVDD and connect the second terminal of the drive transistor T1 to a first terminal of the light-emitting element 110. A second terminal of the light-emitting element 110 is connected to the second power signal output terminal PVEE. The second reset module 1125 operates in response to the second scanning signal SCAN2 and is configured to connect the first terminal of the light-emitting element 110 to the second reference voltage signal output terminal VREF2. The dummy wires are configured to receive at least one of the following signals: the first power signal pvdd, the second power signal pvee, the first reference voltage signal vref1, or the second reference voltage signal vref2.

By way of example, in the case where the pixel driving circuit 112 is a 7T1C circuit, the pixel driving circuit 112 includes the drive transistor T1, the light emission control module 1121, the data write module 1122, the threshold detection module 1123, the first reset module 1124, the second reset module 1125, and the storage capacitor Cst. The light emission control module 1121 includes a second transistor T2 and a third transistor T3. The data write module 1122 includes a fourth transistor T4. The threshold detection module 1123 includes a fifth transistor T5. The first reset module 1124 includes a sixth transistor T6. The second reset module 1125 includes a seventh transistor T7. A first terminal of the sixth transistor T6 is connected to the first reference voltage signal output terminal VREF1. The control terminal of the drive transistor T1 is connected to a second terminal of the sixth transistor T6. The first terminal of the drive transistor T1 is connected to a second terminal of the second transistor T2 and a second terminal of the fourth transistor T4, respectively. The second terminal of the drive transistor T1 is connected to a first terminal of the third transistor T3 and a second terminal of the fifth transistor T5, respectively. A first terminal of the second transistor T2 is connected to the first power signal output terminal PVDD. A control terminal of the second transistor T2 and a control terminal of the third transistor T3 are both connected to a light emission control signal output terminal EM. A second terminal of the third transistor T3 is connected to the first terminal of the light-emitting element 110 and a second terminal of the seventh transistor T7, respectively. The second terminal of the light-emitting element 110 is connected to the second power signal output terminal PVEE. A control terminal of the fourth transistor T4 is connected to the second scanning signal SCAN2. A first terminal of the fourth transistor T4 is connected to the data line 104. A control terminal of the fifth transistor T5 is connected to the second scanning signal SCAN2. A first terminal of the fifth transistor T5 is connected to the second terminal of the sixth transistor T6. A control terminal of the sixth transistor T6 is connected to the first scanning signal SCAN1. A first terminal of the sixth transistor T6 is connected to the first reference voltage signal output terminal VREF1. A control terminal of the seventh transistor T7 is connected to the second scanning signal SCAN2. A first terminal of the seventh transistor T7 is connected to the second reference voltage signal output terminal VREF2. The specific working process of the pixel driving circuit 112 includes a reset stage, a data write stage, and a light emission stage. By way of example, the case where the transistors in the pixel driving circuit 112 are all PNP transistors, turned on at a logic high level, and turned off at a logic low level is used as an example for illustration. In the reset stage, the sixth transistor T6 is turned on, the drive transistor T1, the second transistor T2, the third transistor T3, the fourth transistor T4, the fifth transistor T5, and the seventh transistor T7 are turned off, and the first reference voltage signal vref1 outputted by the first reference voltage signal output terminal VREF1 is written into N1, so as to initialize the control terminal of the drive transistor T1. In the data write stage, the drive transistor T1, the fourth transistor T4, the fifth transistor T5, and the seventh transistor T7 are turned on, the second transistor T2, the third transistor T3, and the sixth transistor T6 are turned off, and the second reference voltage signal vref2 outputted by the second reference voltage signal output terminal VREF2 is written into N4, so as to initialize the first terminal of the light-emitting element 110: a data signal Vdata outputted by a data line DATA flows to N2 through the fourth transistor T4, then flows to N3 through the drive transistor T1, and flows to N1 through the fifth transistor. In the light emission stage, the drive transistor T1, the second transistor T2, and the third transistor T3 are turned on, and the fourth transistor T4, the fifth transistor T5, the sixth transistor T6, and the seventh transistor T7 are turned off, so as to form a current path from the first power signal output terminal PVDD and the second power signal output terminal PVEE, thereby turning on the light-emitting element 110. To ensure the display effect of the light-emitting elements 110 in the display region 101, the first power signal pvdd, the second power signal pvee, the first reference voltage signal vref1 or the second reference voltage signal vref2 are connected to the dummy wires 108 around projections of the light-emitting elements 110, so as to reduce the current attenuation of different signals due to wire resistance, thereby effectively improving the display effect of the display panel 100.

Figure 6:
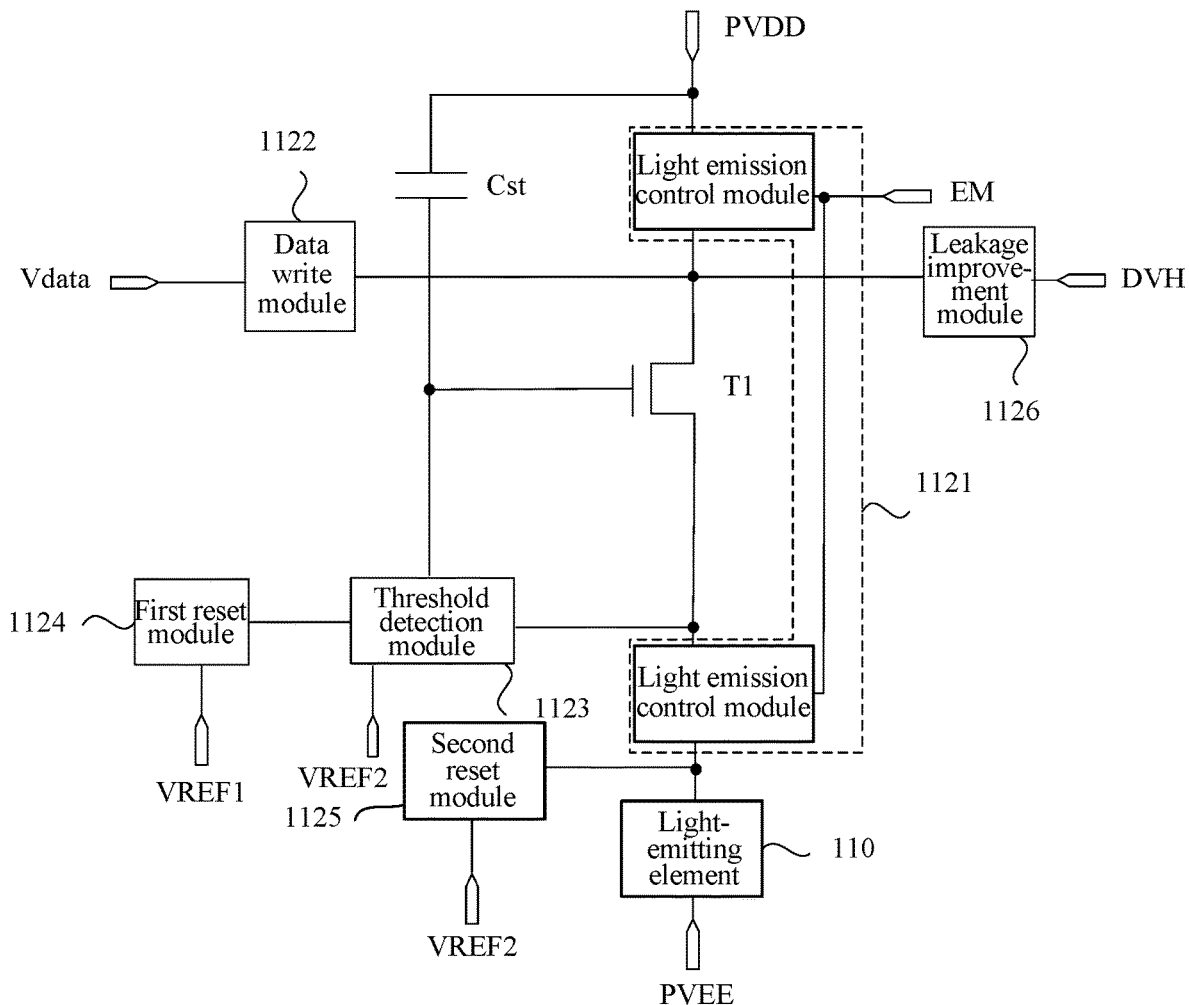
FIG. 6 is a structural diagram of another pixel driving circuit according to an embodiment of the present disclosure.
Figure 7:
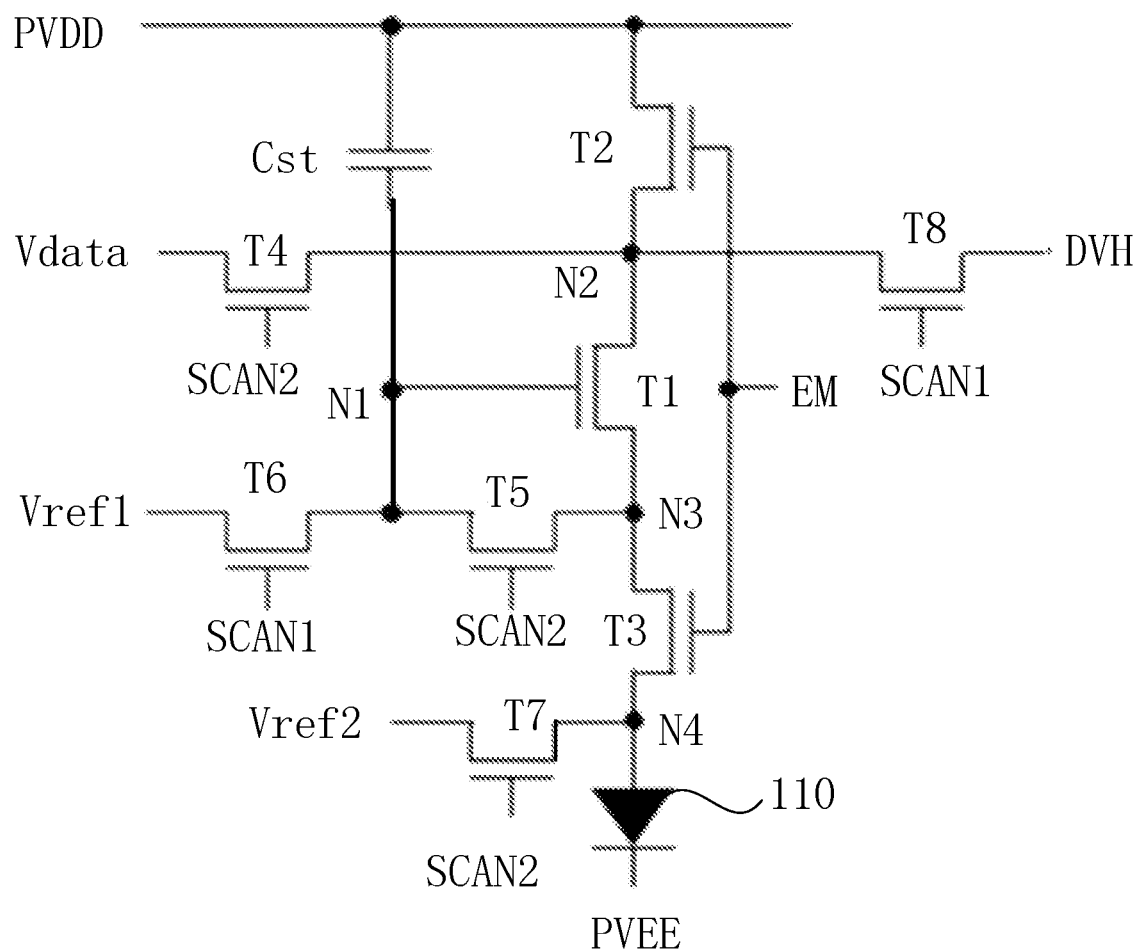
FIG. 7 is a diagram showing the circuit structure of another pixel driving circuit according to an embodiment of the present disclosure.

Optionally, FIG. 6 is a structural diagram of another pixel driving circuit according to an embodiment of the present disclosure, and FIG. 7 is a diagram showing the circuit structure of another pixel driving circuit according to an embodiment of the present disclosure. As shown in FIGS. 6 and 7, the pixel driving circuit 112 further includes a leakage improvement module 1126. The leakage improvement module 1126 operates in response to the first scanning signal SCAN1 so as to connect the third power signal output terminal DVH to the first terminal of the drive transistor T1. The dummy wires 108 are configured to receive at least one of the following signals: the first power signal pvdd, the second power signal pvee, the first reference voltage signal vref1, the second reference voltage signal vref2, or the third power signal dvh.

The drive transistor T1, the light emission control module 1121, the data write module 1122, the threshold detection module 1123, the first reset module 1124, the second reset module 1125, and the storage capacitor Cst in the pixel driving circuit 112 in FIG. 4 are the same as the drive transistor T1, the light emission control module 1121, the data write module 1122, the threshold detection module 1123, the first reset module 1124, the second reset module 1125, and the storage capacitor Cst in the pixel driving circuit 112 in FIG. 6. In FIGS. 6 and 7, the pixel driving circuit further includes a leakage improvement module 1126. The leakage improvement module 1126 includes an eighth transistor T8. A control terminal of the eighth transistor T8 is connected to the first scanning signal SCAN1. A second terminal of the eighth transistor T8 is connected to the first terminal of the drive transistor T1 and the second terminal of the fourth transistor T4, respectively. A first terminal of the eighth transistor T8 is connected to the third power signal output terminal DVH. By way of example, the case where the transistors in the pixel driving circuit 112 are all PNP transistors, turned on at a logic high level, and turned off at a logic low level is used as an example for illustration. In the reset stage, the eighth transistor T8 is turned on, and the third power signal dvh is written into N2, so as to improve the leakage phenomenon of the drive transistor T1. In the data write stage and the light emission stage, the eighth transistor T8 is off. The rest of the working process is the same as the working process of the pixel driving circuit in FIG. 5, which is not repeated here. In the case where the light-emitting elements 110 in the display panel 100 are driven by 8T1C circuits, to ensure the display effect of the light-emitting elements 110 in the display region 101, the first power signal pvdd, the second power signal pvee, the first reference voltage signal vref1, the second reference voltage signal vref2, or the third power signal dvh are connected to the dummy wires 108 around projections of the light-emitting elements 110, so as to reduce the current attenuation of different signals due to wire resistance, thereby effectively improving the display effect of the display panel 100.

Figure 8:
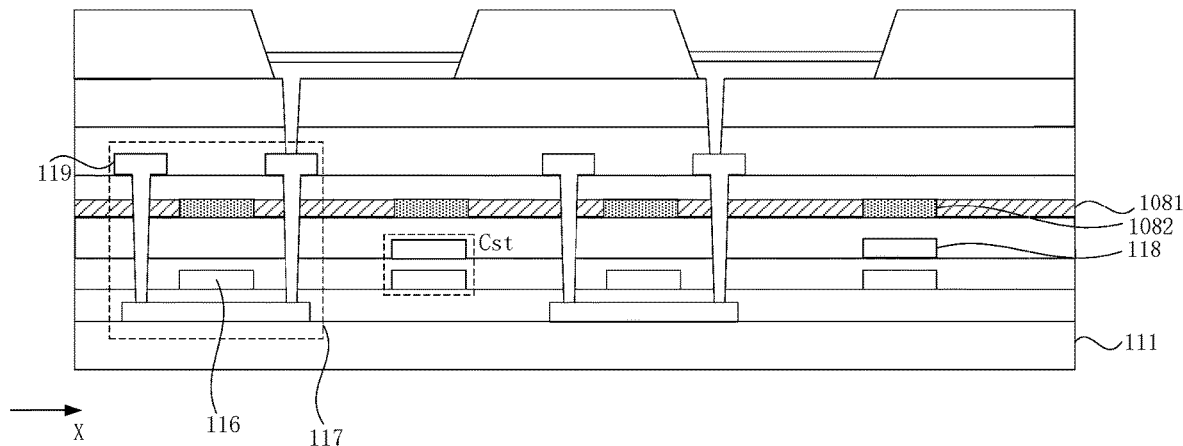
FIG. 8 is a structural diagram of another display panel according to an embodiment of the present disclosure.

Optionally, FIG. 8 is a structural diagram of another display panel according to an embodiment of the present disclosure. As shown in FIG. 8, the first dummy wires 1081 and the second dummy wires 1082 are configured in the same layer and electrically connected to form the grid structure 109. The dummy wires 108 are configured to receive the first power signal pvdd, the second power signal pvee, the first reference voltage signal vref1, the second reference voltage signal vref2, or the third power signal dvh.

The first dummy wires 1081 and the second dummy wires 1082 are configured in the same layer, and the same layer of metal is etched so as to form the grid structure 109. In this case, the first dummy wires 1081 and the second dummy wires 1082 are electrically connected. To ensure the normal display of the display region 101 and avoid the current attenuation caused by the resistance of the dummy wires 108, the first dummy wires 1081 and the second dummy wires 1082 may be configured to receive the same fixed signal, where the fixed signal may be the first power signal pvdd, the second power signal pvee, the first reference voltage signal vref1, the second reference voltage signal vref2, or the third power signal dvh so that while the display effect of the display panel 100 is ensured, the complexity of signal access is effectively reduced, thereby simplifying the manufacturing process of the display panel 100.

Figure 9:
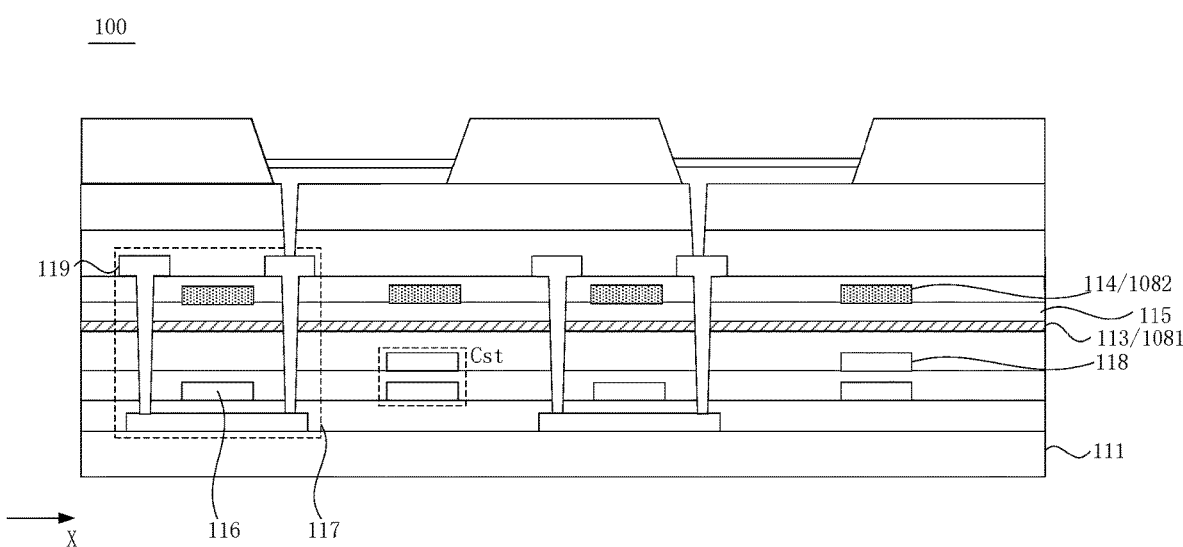
FIG. 9 is a structural diagram of another display panel according to an embodiment of the present disclosure.

Optionally, FIG. 9 is a structural diagram of another display panel according to an embodiment of the present disclosure. As shown in FIG. 9, the first dummy wires 1081 are configured in a first metal layer 113, the second dummy wires 1082 are configured in a second metal layer 114, and an insulating layer 115 is provided between the first metal layer 113 and the second metal layer 114. The first dummy wires 1081 and the second dummy wires 1082 are electrically connected through the insulating layer 115, and the dummy wires 108 are configured to receive the first power signal pvdd, the second power signal pvee, the first reference voltage signal vref1, the second reference voltage signal vref2, or the third power signal dvh.

The first dummy wires 1081 and the second dummy wires 1082 may be located in different layers, that is, the first dummy wires 1081 are configured in the first metal layer 113, and the second dummy wires 1082 are configured in the second metal layer 114, where the first metal layer 113 and the second metal layer 114 may be additionally provided metal films. Alternatively, an electrode plate layer 118 or a source-drain layer 119 and other metal films in the display panel 100 are reused as the first metal layer 113 and the second metal layer 114, so as to avoid additionally provided metal films, thereby reducing the manufacturing cost. By way of example, in FIG. 9, the case where the first metal layer 113 and the second metal layer 114 are both additionally provided metal films is used as an example for illustration. The insulating layer 115 is provided between the first metal layer 113 and the second metal layer 114. In the case where the first dummy wires 1081 and the second dummy wires 1082 are configured to receive the same fixed signal, holes are drilled in the insulating layer 115, so as to achieve the electrical connection between the first dummy wires 1081 and the second dummy wires 1082, thereby ensuring that the fixed signal may be the first power signal pvdd, the second power signal pvee, the first reference voltage signal vref1, the second reference voltage signal vref2, or the third power signal dvh, ensuring that the fixed signal may be transmitted in the first dummy wires 1081 and the second dummy wires 1082, and ensuring the normal display of the display region 101.

Optionally, still referring to FIG. 9, the first dummy wires 1081 are configured in the first metal layer 113, the second dummy wires 1082 are configured in the second metal layer 114, and the first dummy wires 1081 are insulated from the second dummy wires 1082. The first dummy wires 1081 are configured to receive the first power signal pvdd, the second power signal pvee, the first reference voltage signal vref1, the second reference voltage signal vref2, or the third power signal dvh; and the second dummy wires 1082 are configured to receive one of the first power signal pvdd, the second power signal pvee, the first reference voltage signal vref1, the second reference voltage signal vref2 or the third power signal dvh that is different from the signal to which the dummy wires 1081 are configured to receive.

The first dummy wires 1081 and the second dummy wires 1082 may be located on different layers, that is, the first dummy wires 1081 is configured in the first metal layer 113, and the second dummy wires 1082 are configured in the second metal layer 114. To avoid the short circuit between the first dummy wires 1081 and the second dummy wires 1082, the dummy wires 1081 are insulated from the second dummy wires 1082. To ensure the display uniformity of the display region 101 in the display panel 100, the first dummy wires 1081 and the second dummy wires 1082 may be configured to receive the preceding fixed signal, so as to reduce the current attenuation of different signals due to wire resistance. In this case, since the first dummy wires 1081 and the second dummy wires 1082 are configured in different layers, the first dummy wires 1081 and the second dummy wires 1082 may be configured to receive different fixed signals, respectively. The first dummy wires 1081 and the second dummy wires 1082 are configured to receive different signals among the first power signal pvdd, the second power signal pvee, the first reference voltage signal vref1, the second reference voltage signal vref2, or the third power signal dvh, thereby improving the display effect of the display panel.

Figure 10:
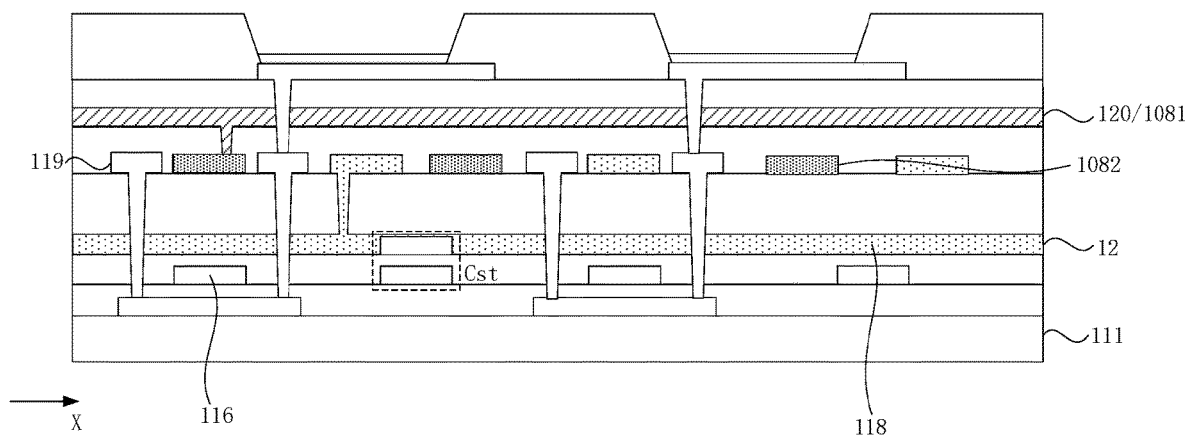
FIG. 10 is a structural diagram of another display panel according to an embodiment of the present disclosure.

Optionally, FIG. 10 is a structural diagram of another display panel according to an embodiment of the present disclosure. As shown in FIG. 10, the display panel 100 includes the substrate 111, a first gate layer 116, an electrode plate layer 118, a source-drain layer 119, and a third metal layer 120. The first gate layer 116 is configured on one side of the substrate 111 and provided with a gate layer of a first thin-film transistor 117 in the sub-pixel region 105 and a first plate of the storage capacitor Cst. The electrode plate layer 118 is configured on one side of the first gate layer 116 facing away from the substrate 111 and provided with a second plate of the storage capacitor Cst and second reference voltage signal lines 12 extending along the first direction X. The source-drain layer 119 is configured on one side of the electrode plate layer 118 facing away from the substrate 111 and provided with a source and a drain of the first thin-film transistor 117. The third metal layer 120 is configured on one side of the source-drain layer 119 facing away from the substrate 111 and provided with the first dummy wires 1081 extending along the first direction X. The first dummy wires 1081 are configured to receive the first reference voltage signal vref1. An absolute value of the first reference voltage signal vref1 is greater than an absolute value of the second reference voltage signal vref2.

The substrate 111 may be a flexible substrate or a rigid substrate, and constituent materials of the substrate 111 include one or more combinations of polyethersulfone, polyacrylate, polyetherimide, polyethylene naphthalate, polyethylene terephthalate, polyphenylene sulfide, polyarylate, polyimide, polycarbonate and cellulose acetate propionate polymer resin. The pixel driving circuit 112 for driving the light-emitting element 110 to emit light includes the first thin-film transistor 117 and the storage capacitor Cst. The first thin-film transistor 117 is a bottom-gate thin-film transistor. The first thin-film transistor 117 sequentially includes the first gate layer 116 provided with the gate layer and the source-drain layer 119 provided with the source and drain. The first gate layer 116 is also reused as the first plate of the storage capacitor Cst. The electrode plate layer 118 configured on one side of the first gate layer 116 facing away from the substrate 111 is provided with the second plate of the storage capacitor Cst. At the same time, the electrode plate layer 118 is also provided with the reference voltage signal lines, that is, the second reference voltage signal lines 12 extending along the first direction X. The third metal layer 120 configured on one side of the source-drain layer 119 facing away from the substrate 111 is provided with the first dummy wires 1081 extending along the first direction X. The first dummy wires 1081 are configured to receive the first reference voltage signal vref1. The constituent material of the electrode plate layer 118 of the storage capacitor Cst is molybdenum, and the constituent material of the third metal layer 120 is titanium-aluminum-titanium composite metal. During the display process of the display panel 100, the absolute value of the first reference voltage signal vref1 is greater than the absolute value of the second reference voltage signal vref2. Therefore, by way of example, the first reference voltage signal vref1 is used for resetting the drive transistors in the pixel driving circuit 112, and the second reference voltage signal vref2 is used for resetting the first terminal of the light-emitting element 110. The first reference voltage signal vref1 is −3.5V, and the second reference voltage signal vref2 is −3V. The signal transmission time is the same during the signal transmission process, the first reference voltage signal vref1 becomes −3V, the second reference voltage signal vref2 becomes −2.7V, a voltage drop loss of the first reference voltage signal vref1 is relatively large, and the conductivity of the third metal layer 120 is higher than the conductivity of the electrode plate layer 118. In this case, the first reference voltage signal vref1 is transmitted in the third metal layer 120, which is conducive to the reset uniformity in the reset stage during the working process of the pixel driving circuit 112, so as to balance the charging time of each display region, thereby further improving the display uniformity of the display panel 100.

Optionally, still referring to FIG. 10, the source-drain layer 119 is further provided with second reference voltage signal lines 12 extending along the second direction Y and the second dummy wires 1082 extending along the second direction Y, and the second dummy wires 1082 on the source-drain layer 119 are configured to receive the first reference voltage signal vref1.

The source-drain layer 119 may be provided with multiple second reference voltage signal lines 12 extending along the second direction Y and multiple second dummy wires extending along the second direction Y in addition to the source and drain. In this case, the third metal layer 120 is provided with the first dummy wires 1081 extending along the first direction X, the source-drain layer 119 is provided with the second dummy wires 1082 extending along the second direction Y, and the first dummy wires 1081 and the second dummy wires 1082 are configured to receive the first reference voltage signal vref1. In this case, after the first reference voltage signal vref1 is first transmitted in the third metal layer 120 along the first direction X and then transmitted in the source-drain layer 119 along the second direction Y through a via hole. At the same time, the second reference voltage signal vref2 is first transmitted in the electrode plate layer 118 along the first direction X and then transmitted in the source-drain layer 119 along the second direction Y through a via. On the plane parallel to the substrate 111, projections of the first dummy wires 1081 and the second dummy wires 1082 form the grid structure 109, projections of the second reference voltage signal lines 12 also form the grid structure 109, and the projections of the dummy wires 108 and the projections of the second reference voltage signal lines do not overlap and form a multi-layer grid structure in space. The multi-layer grid structure 109 is arranged around the light-emitting element 110, thereby effectively reducing the coupling capacitance, preventing crosstalk between signals, and playing a certain shielding role.

Figure 11:
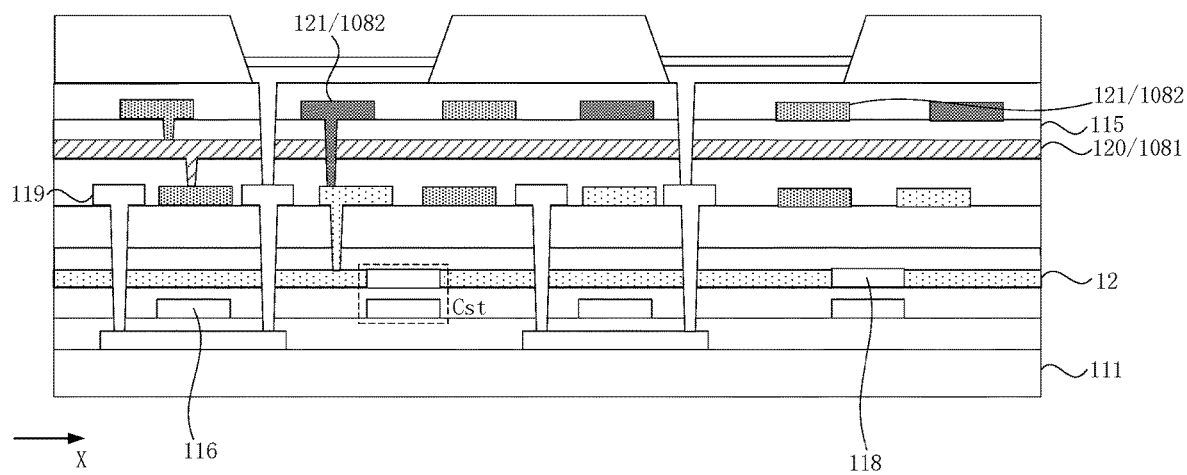
FIG. 11 is a structural diagram of another display panel according to an embodiment of the present disclosure.

Optionally, FIG. 11 is a structural diagram of another display panel according to an embodiment of the present disclosure. As shown in FIG. 11, the display panel 100 further includes the insulating layer 115 and a fourth metal layer 121. The insulating layer 115 is configured on one side of the third metal layer 120 facing away from the substrate 111. The fourth metal layer 121 is configured on one side of the insulating layer 115 facing away from the substrate 111 and provided with the second dummy wires 1082 extending along the second direction Y. At least part of the second dummy wires 1082 in the fourth metal layer 121 are configured to receive the first reference voltage signal vref1.

Based on the preceding embodiments, the fourth metal layer 121 is configured on one side of the third metal layer 120 facing away from the substrate 111, the third metal layer 120 and the fourth metal layer 121 are insulated through the insulating layer 115, and the fourth metal layer 121 is provided with multiple second dummy wires 1082 extending along the second direction Y. In the case where part of the second dummy wires 1082 in the fourth metal layer 121 are configured to receive the first reference voltage signal vref1, the first reference voltage signal vref1 connected to the dummy wires 108 is first transmitted in the third metal layer 120 along the first direction X, then transmitted in the source-drain layer 119 along the second direction Y through a via hole, and then transmitted in the fourth metal layer 121 along the second direction Y through a via hole. On the plane parallel to the substrate 111, the projections of the first dummy wires 1081 and the second dummy wires 1082 form the multi-layer grid structure 109, and the dummy wires 108 are connected in parallel, so as to reduce the resistance of the dummy wires 108, thereby ensuring the display effect of the display panel 100.

Optionally, referring to FIG. 11, part of the second dummy wires 1082 in the fourth metal layer 121 are configured to receive the second reference voltage signal vref2, and in the fourth metal layer 121, the second dummy wires 1082 configured to receive the first reference voltage signal vref1 are insulated from the second dummy wires 1082 configured to receive the second reference voltage signal vref2.

The fourth metal layer 121 is provided with multiple second dummy wires 1082 extending along the second direction Y. In the case where part of the second dummy wires 1082 in the fourth metal layer 121 are connected to the second reference voltage signal vref2, to avoid signal crosstalk, the second dummy wires 1082 configured to receive the second reference voltage signal vref2 in the fourth metal layer 121 are insulated from the second dummy wires 1082 configured to receive the first reference voltage signal vref1 in the fourth metal layer 121. The second reference voltage signal vref2 is first transmitted in the electrode plate layer 118 along the first direction X, then transmitted in the source-drain layer 119 along the second direction Y through a via, and then transmitted in the fourth metal layer 121 along the second direction Y through a via hole. On the plane parallel to the substrate 111, the projections of the second reference voltage signal lines 12 also form the grid structure 109, and the projections of the second reference voltage signal lines 12 and the projections of the first dummy wires 1081 and the second dummy wires 1082 form the multi-layer grid structure 109, and wires in layers are connected in parallel, so as to reduce the resistance, thereby further improving the shielding effect, effectively reducing the coupling capacitance, and ensuring the display effect of the display panel 100.

Figure 12:
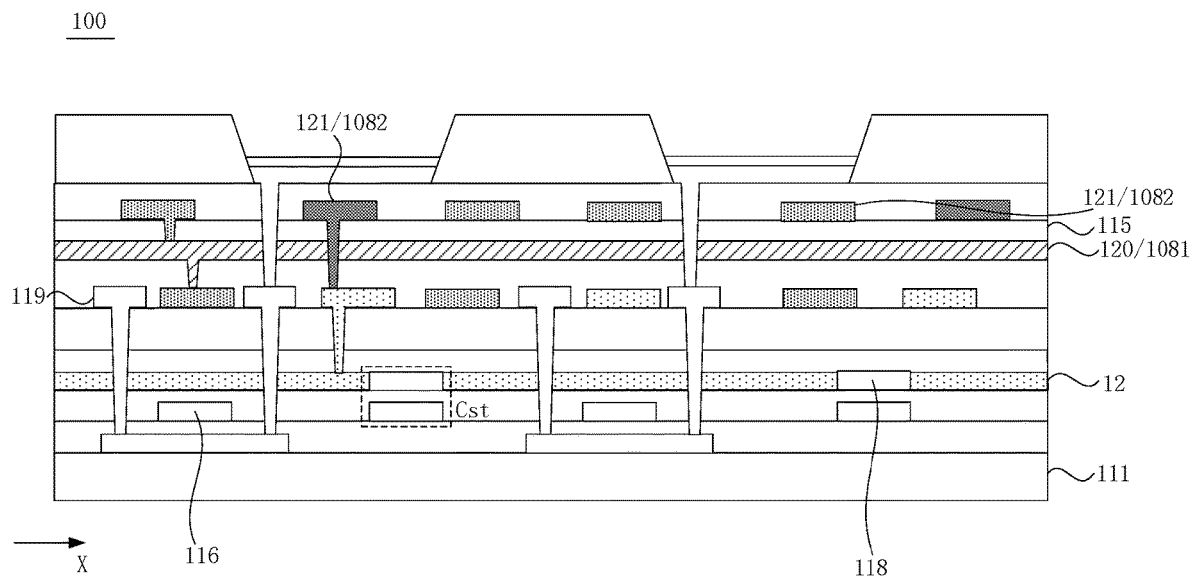
FIG. 12 is a structural diagram of another display panel according to an embodiment of the present disclosure.

Optionally, FIG. 12 is a structural diagram of another display panel according to an embodiment of the present disclosure. As shown in FIG. 12, in the fourth metal layer 121, a number of the second dummy wires 1082 configured to receive the first reference voltage signal vref1 is greater than a number of the second dummy wires 1082 configured to receive the second reference voltage signal vref2.

Since the voltage drop loss of the first reference voltage signal vref1 during the signal transmission process is relatively large, in the fourth metal layer 121, the number of the second dummy wires 1082 configured to receive the first reference voltage signal vref1 is greater than the number of the second dummy wires 1082 configured to receive the second reference voltage signal vref2, so as to adaptively increase the number of the second dummy wires 1082 configured to receive the first reference voltage signal vref1, thereby further reducing the voltage drop loss of the first reference voltage signal vref1, balancing the charging time of each display region, and improving the display uniformity of the display panel 100.

Figure 13:
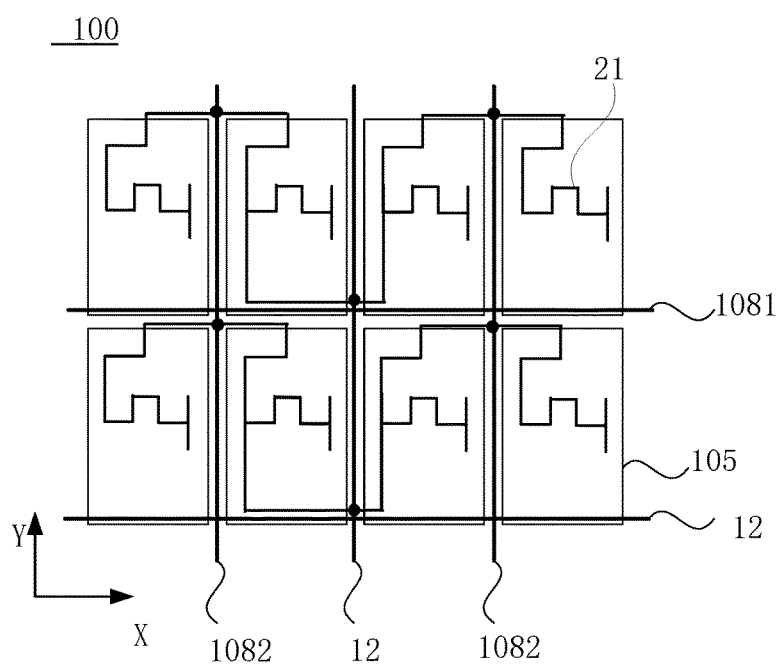
FIG. 13 is a structural diagram of another display panel according to an embodiment of the present disclosure.

Optionally, FIG. 13 is a structural diagram of another display panel according to an embodiment of the present disclosure. As shown in FIG. 13, along the first direction X, the second dummy wires 1082 and the second reference voltage signal lines 12 extending along the second direction Y are alternately arranged. Along the second direction Y, the first dummy wires 1081 and the second reference voltage signal lines 12 extending along the first direction X are alternately arranged. Along the first direction X, the sub-pixel regions 105 in an i-th column and the sub-pixel regions 105 in an (i+1)-th column share the first reference voltage signal vref1 outputted by the second dummy wires 1082. The sub-pixel regions 105 in the (i+1)-th column and the sub-pixel regions 105 in an (i+2)-th column share the second reference voltage signal line 12, where $1 \leq i \leq N-2$, and N denotes a total number of columns in the sub-pixel regions.

Along the first direction X, multiple second dummy wires 1082 and multiple second reference voltage signal lines 12 are provided, and the second dummy wires 1082 and the second reference voltage signal lines 12 are alternately arranged. In this case, the sub-pixel regions 105 in the first column and the sub-pixel regions 105 in the second column share the second dummy wire 1082, and the first reference voltage signal vref1 is transmitted in the second dummy wire 1082. In this case, the first reference voltage signal vref1 may reset gates of the drive transistors T1 in the sub-pixel regions 105 in the first column and the sub-pixel regions 105 in the second column, respectively. The sub-pixel regions 105 in the second column and the sub-pixel regions 105 in the third column share the second reference voltage signal line 12, the second reference voltage signal vref2 is transmitted in the second reference voltage signal line 12, and the second reference voltage signal vref2 may reset first terminals of corresponding light-emitting elements 110 of the sub-pixel regions 105 in the second column, respectively, thereby effectively saving the layout space of the sub-pixel regions 105. Active layers 21 of adjacent sub-pixel regions 105 may be connected along the first direction X, thereby improving the electrical uniformity of the thin-film transistors in the sub-pixel regions 105. At the same time, the dummy wires 108 are configured in parallel, so as to reduce the resistance of the dummy wires 108, thereby ensuring the display uniformity of the display panel 100.

Figure 14:
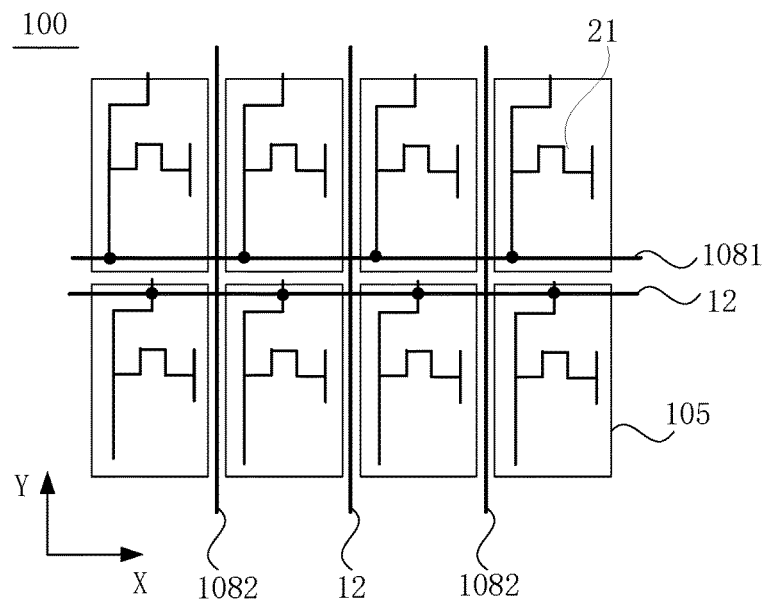
FIG. 14 is a structural diagram of another display panel according to an embodiment of the present disclosure.

Optionally, FIG. 14 is a structural diagram of another display panel according to an embodiment of the present disclosure. As shown in FIG. 14, along the first direction X, the second dummy wires 1082 and the second reference voltage signal lines 12 extending along the second direction Y are alternately arranged. Along the second direction Y, the first dummy wires 1081 and the second reference voltage signal lines 12 extending along the first direction X are alternately arranged. Along the second direction Y, the sub-pixel regions 105 in a p-th row share the first reference voltage signal vref1 outputted by the first dummy wires 1081, and the sub-pixel regions 105 in a (p+1)-th row share the second reference voltage signal line 12, where 1≤p≤M−1, and M denotes a total number of rows in the sub-pixel regions.

Along the second direction Y, multiple first dummy wires 1081 and multiple second reference voltage signal lines 12 are provided, and the first dummy wires 1081 and the second reference voltage signal lines 12 are alternately arranged. Therefore, in this case, the sub-pixel regions 105 in the first row share the first dummy wire 1081, and the first reference voltage signal vref1 is transmitted in the first dummy wire 1081. In this case, the first reference voltage signal vref1 may reset first terminals of corresponding light-emitting elements 110 in the sub-pixel regions 105 in the first row, respectively. The sub-pixel regions 105 in the second row share the second reference voltage signal line 12, the second reference voltage signal vref2 is transmitted in the second reference voltage signal line 12, and the second reference voltage signal vref2 may reset gates of corresponding drive transistors T1 in the sub-pixel regions 105 in the second row, respectively, thereby effectively saving the layout space of the sub-pixel regions 105. The active layers 21 of adjacent sub-pixel regions 105 may be connected along the first direction X, thereby improving the electrical uniformity of the thin-film transistors in the sub-pixel regions 105. At the same time, the dummy wires 108 are configured in parallel, so as to reduce the resistance of the dummy wires 108, thereby ensuring the display uniformity of the display panel 100.

Figure 15:
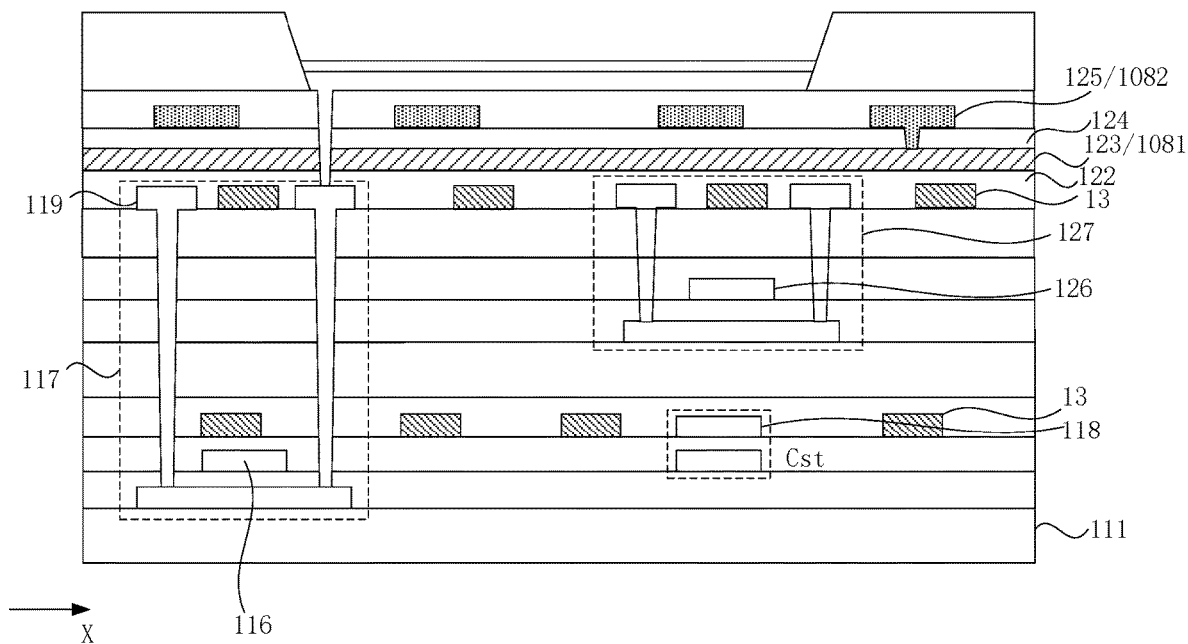
FIG. 15 is a structural diagram of another display panel according to an embodiment of the present disclosure.

Optionally, FIG. 15 is a structural diagram of another display panel according to an embodiment of the present disclosure. As shown in FIG. 15, the display panel 100 includes the substrate 111, the first gate layer 116, the electrode plate layer 118, the source-drain layer 119, a first planarization layer 122, a fifth metal layer 123, a second planarization layer 124, and a sixth metal layer 125. The first gate layer 116 is configured on one side of the substrate 111 and provided with the gate layer of the first thin-film transistor 117 in the sub-pixel region and the first plate of the storage capacitor Cst. The electrode plate layer 118 is configured on one side of the first gate layer 116 facing away from the substrate 111 and provided with the second electrode of the storage capacitor Cst and reference voltage signal lines 13. The source-drain layer 119 is configured on one side of the electrode plate layer 118 facing away from the substrate 111 and provided with a source and a drain of the first thin-film transistor 117 and reference voltage signal lines 13. The first planarization layer 122 is configured on one side of the source-drain layer 119 facing away from the substrate 111. The fifth metal layer 123 is configured on one side of the first planarization layer 122 facing away from the substrate 111 and provided with the first dummy wires 1081. The second planarization layer 124 is configured on one side of the fifth metal layer 123 facing away from the substrate 111. The sixth metal layer 125 is configured on one side of the second planarization layer 124 facing away from the substrate 111 and provided with the second dummy wires 1082. The first dummy wires 1081 and the second dummy wires 1082 are configured to receive the third power signal dvh.

In the case where the pixel driving circuit 112 in the sub-pixel region 105 is an 8T1C circuit, the display panel 100 is sequentially provided with the substrate 111, the first gate layer 116, the electrode plate layer 118, the source-drain layer 119, the first planarization layer 122, the fifth metal layer 123, the second planarization layer 124, and the sixth metal layer 125. The first gate layer 116 is provided with a gate of the first thin-film transistor 117 and the first plate of the storage capacitor Cst. The electrode plate layer 118 is provided with the second plate of the storage capacitor Cst and the reference voltage signal lines. The source-drain layer 119 is provided with the source and drain of the first thin-film transistor 117 and the reference voltage signal lines. The first planarization layer 122 and the second planarization layer 124 are used for balancing the step difference between films. The fifth metal layer 123 is provided with multiple first dummy wires 1081. The sixth metal layer 125 is provided with multiple second dummy wires 1082. On the plane parallel to the substrate 111, the projections of the first dummy wires 1081 and the second dummy wires 1082 form the grid structure 109. The first dummy wires 1081 and the second dummy wires 1082 are configured to receive the same fixed signal. The fixed signal may be the third power signal dvh, and the third power signal dvh is outputted from the third power signal output terminal DVH of the eighth transistor T8, thereby ensuring the normal display of the display region 101.

Optionally, with continued reference to FIG. 15, a second gate layer 126 is further provided between the electrode plate layer 118 and the source-drain layer, where the second gate layer 126 is provided with a gate layer of a second thin-film transistor 127 in the sub-pixel region. The first thin-film transistor 117 is a p-type thin-film transistor, and the second thin-film transistor 127 is an n-type thin-film transistor.

The second gate layer 126 is further provided between the electrode plate layer 118 and the source-drain layer 119. The second thin-film transistor 127 in the sub-pixel region includes the second gate layer 126, and the second gate layer 126 is configured on one side of the gate layer of the first thin-film transistor 117 facing away from the substrate 111. Sources and drains of the first thin-film transistor 117 and the second thin-film transistor 127 may be prepared on the same layer. An active layer of the first thin-film transistor 117 is low temperature polysilicon, and the first thin-film transistor 117 is a p-type thin-film transistor. An active layer of the second thin-film transistor 127 is an oxide, and the second thin-film transistor 127 is an n-type thin-film transistor.

Optionally, with continued reference to FIG. 15, the first dummy wires 1081 and the second dummy wires 1082 are electrically connected through the second planarization layer 124.

Since the first dummy wires 1081 are configured in the fifth metal layer 123 and the second dummy wires 1082 are configured in the sixth metal layer 125, the first dummy wires 1081 and the second dummy wires 1082 are configured in different layers. To achieve the electrical connection between the first dummy wires 1081 and the second dummy wires 1082, a via may be provided on the second planarization layer 124 so that the same third power signal dvh are transmitted in the first dummy wires 1081 and the second dummy wires 1082.

Figure 16:
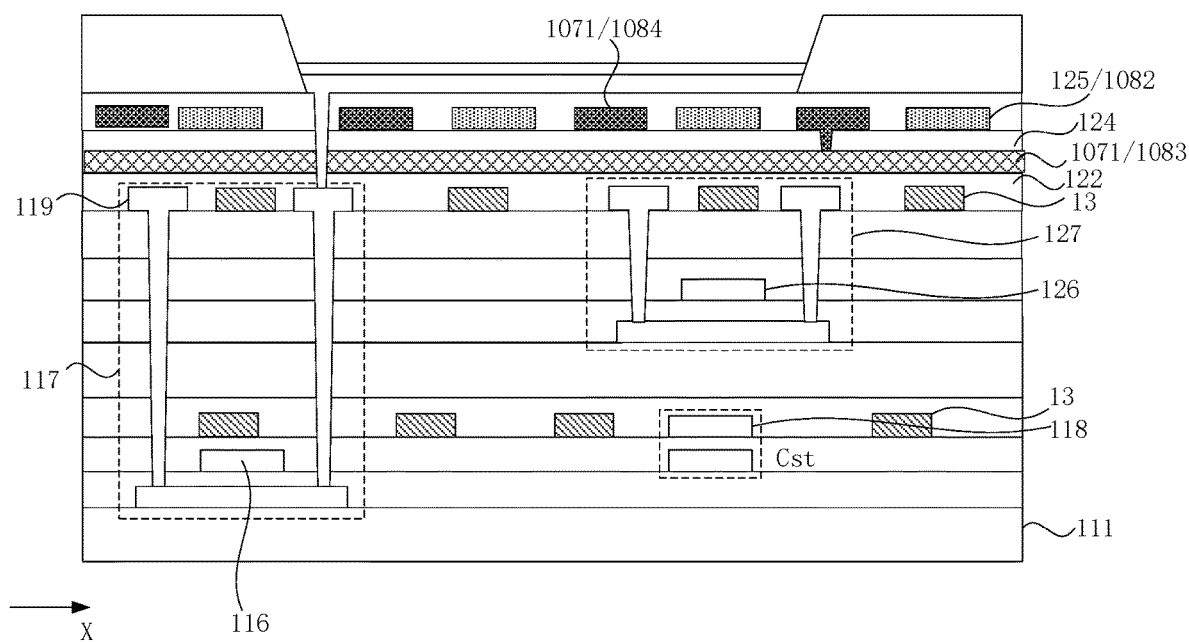
FIG. 16 is a structural diagram of another display panel according to an embodiment of the present disclosure.

Optionally, FIG. 16 is a structural diagram of another display panel according to an embodiment of the present disclosure. As shown in FIG. 16, the fan-out wires 1071 of the display region 101 include third dummy wires 1083 extending along the first direction X and fourth dummy wires 1084 extending along the second direction Y. The third dummy wires 1083 and the first dummy wires 1081 are configured in the same layer; and the fourth dummy wires 1084 and the second dummy wires 1082 are configured in the same layer. The third dummy wires 1083 and the fourth dummy wires 1084 are electrically connected through the second planarization layer 124. Part of the fan-out wires 1071 extending to the non-display region 102 are converted to the first gate layer 116 or the electrode plate layer 118.

The fan-out wires 1071 of the display region 101 include the third dummy wires 1083 extending along the first direction X and the fourth dummy wires 1084 extending along the second direction Y. The third dummy wires 1083 and the first dummy wires 1081 are configured in the same layer, and the same signal or different signals may be transmitted on the third dummy wires 1083 and the first dummy wires 1081. The fourth dummy wires 1084 and the second dummy wires 1082 are configured in the same layer, and the same signal or different signals may be transmitted on the fourth dummy wires 1084 and the second dummy wires 1082. The third dummy wires 1083 and the fourth dummy wires 1084 are configured in different layers, and the third dummy wires 1083 and the fourth dummy wires 1084 are electrically connected through the second planarization layer 124 so that the same signal is transmitted in the third dummy wires 1083 and the fourth dummy wires 1084 that are electrically connected to each other. Part of the fan-out wires 1071 extending to the non-display region 102 are converted to the first gate layer 116 or the electrode plate layer 118, and the fan-out wires 1071 are disposed in the film of the display panel 100, thereby ensuring that the fan-out wires 1071 extend to the display region 101 of the display panel 100 through the non-display region 102 of the display panel 100. The dummy wires 108 are reused as the fan-out wires 1071 partially located in the display region 101 so that a difference between connection distances between the fan-out wires 1071 and the data lines 104 at different positions is reduced while the normal display effect of the display panel 100 is ensured.

Figure 17:
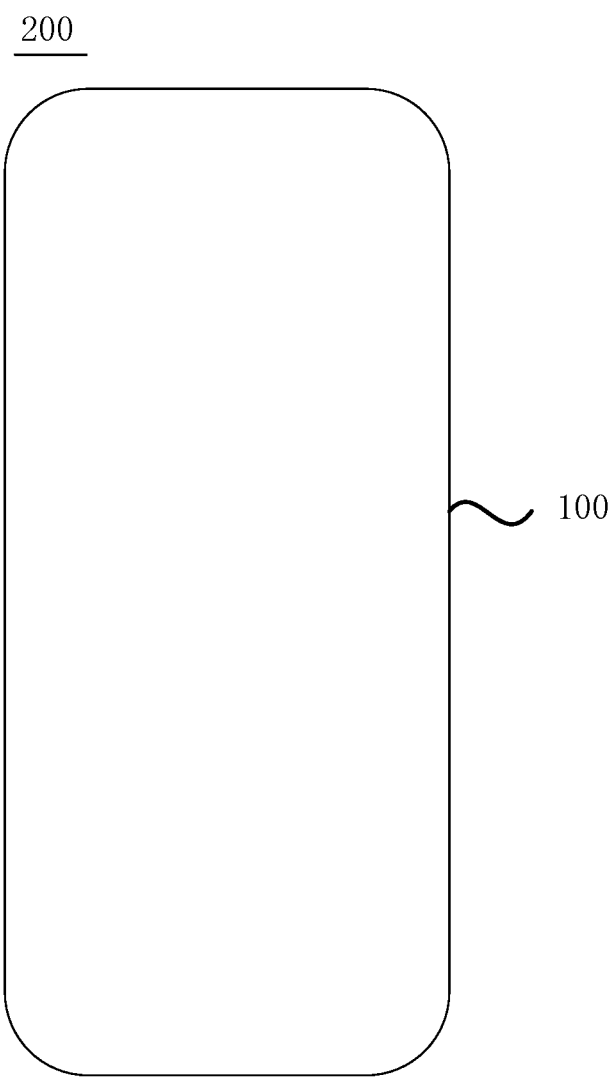
FIG. 17 is a structural diagram of a display device according to an embodiment of the present disclosure.

An embodiment of the present disclosure further provides a display device. The display device includes any display panel provided in the preceding embodiments. By way of example, as shown in FIG. 17, a display device 200 includes the display panel 100 according to any embodiment of the present disclosure. Therefore, the display device also has the beneficial effects of the display panel described in the preceding embodiments, and for the same details, reference may be made to the description of the preceding display panel, and repetition will not made herein.

The display device 200 provided in the embodiment of the present disclosure may be a phone shown in FIG. 17, or may be any electronic product with a display function, including and not limited to: a television, a laptop, a desktop display, a tablet computer, a digital camera, a smart bracelet, smart glasses, an in-vehicle display, industry-controlling equipment, a medical display, a touch interactive terminal and the like, which is not specifically limited in the embodiments of the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations and substitutions can be made without departing from the scope of the present disclosure. Therefore, while the present disclosure is described in detail in connection with the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising: a substrate, a display region, and a non-display region at least partially surrounding the display region;
   wherein the display region comprises a plurality of scanning lines extending along a first direction and a plurality of data lines extending along a second direction, the first direction intersects with the second direction, and the plurality of scanning lines and the plurality of data lines intersect to define sub-pixel regions;
   wherein the non-display region comprises a plurality of pads;
   wherein the display panel further comprises: a fan-out region configured on one side of the display region closer to the plurality of pads, at least part of the fan-out region is disposed in the display region;
   wherein the fan-out region is provided with a plurality of fan-out wires for connecting the plurality of data lines to corresponding pads, the display region comprises a plurality of dummy wires, wherein the plurality of dummy wires comprise first dummy wires extending along the first direction and second dummy wires extending along the second direction, the plurality of dummy wires are configured to receive at least one of the following signals: a first power signal, a second power signal, a first reference voltage signal, a second reference voltage signal, or a third power signal; and
   wherein projections of the plurality of dummy wires in a plane parallel to the substrate form a grid structure, and the plurality of fan-out wires are insulated from the plurality of dummy wires.

2. The display panel of claim 1, wherein each of the sub-pixel regions comprises at least part of one of the first dummy wires and at least part of one of the second dummy wires.

3. The display panel of claim 1, wherein each of the sub-pixel regions comprises at least one light-emitting element, and on the plane parallel to the substrate, a projection of the at least one light-emitting element is located inside a mesh of the grid structure.

4. The display panel of claim 3, wherein each of the sub-pixel regions further comprises a pixel driving circuit, wherein the pixel driving circuit is electrically connected to a respective one of the at least one light-emitting element and configured to provide an operating voltage for the respective one of the at least one light-emitting element; and
   the pixel driving circuit is connected to at least one of the following: a first power signal output terminal, a second power signal output terminal, a first reference voltage signal output terminal, a second reference voltage signal output terminal, or a third power signal output terminal.

5. The display panel of claim 1, wherein the display region further comprises a plurality of pixel driving circuits electrically connected to corresponding light-emitting elements;
   each of the plurality of pixel driving circuits comprises a drive transistor, a light emission control module, a data write module, a threshold detection module, a first reset module, a second reset module, and a storage capacitor;
   wherein the first reset module operates in response to a first scanning signal to connect a control terminal of the drive transistor to a first reference voltage signal output terminal; the storage capacitor is configured to connect a first power signal output terminal to the control terminal of the drive transistor; the data write module is configured to operate in response to a second scanning signal to connect a first terminal of the drive transistor to a respective one of the plurality of data lines; the threshold detection module is configured to operate in response to the second scanning signal to connect the control terminal of the drive transistor to a second terminal of the drive transistor; and the light emission control module is configured to operate in response to a light emission control signal and configured to connect the first terminal of the drive transistor to the first power signal output terminal and connect the second terminal of the drive transistor to a first terminal of one of the corresponding light-emitting elements; a second terminal of one of the corresponding light-emitting elements is connected to a second power signal output terminal; and the second reset module operates in response to the second scanning signal and is configured to connect the first terminal of one of the corresponding light-emitting elements to a second reference voltage signal output terminal.

6. The display panel of claim 5, wherein each of the plurality of pixel driving circuits further comprises a leakage improvement module, the leakage improvement module operates in response to the first scanning signal to connect a third power signal output terminal to the first terminal of the drive transistor.

7. The display panel of claim 1, wherein the first dummy wires and the second dummy wires are configured in a same layer and electrically connected to form the grid structure; and the plurality of a dummy wires are configured to receive the first power signal, the second power signal, the first reference voltage signal, the second reference voltage signal, or the third power signal.

8. The display panel of claim 1, wherein the first dummy wires are configured in a first metal layer, the second dummy wires are configured in a second metal layer, and an insulating layer is provided between the first metal layer and the second metal layer;

the first dummy wires and the second dummy wires are electrically connected through the insulating layer; and the plurality of dummy wires are configured to receive the first power signal, the second power signal, the first reference voltage signal, the second reference voltage signal, or the third power signal.

9. The display panel of claim 1, wherein the first dummy wires are configured in a first metal layer, the second dummy wires are configured in a second metal layer, and the first dummy wires are insulated from the second dummy wires;

the first dummy wires are configured to receive the first power signal, the second power signal, the first reference voltage signal, the second reference voltage signal, or the third power signal; and the second dummy wires are configured to receive one of: the first power signal, the second power signal, the first reference voltage signal, the second reference voltage signal, or the third power signal that is different from the signal to which the first dummy wires are configured to receive.

10. The display panel of claim 1, further comprising: the substrate;

a first gate layer disposed on one side of the substrate, wherein the first gate layer is provided with a gate layer of a first thin-film transistor in one of the sub-pixel regions and a first plate of a storage capacitor;

an electrode plate layer disposed on one side of the first gate layer facing away from the substrate, wherein the electrode plate layer is provided with a second plate of the storage capacitor and second reference voltage signal lines extending along the first direction;

a source-drain layer disposed on one side of the electrode plate layer facing away from the substrate, wherein the source-drain layer provided with a source and a drain of the first thin-film transistor; and a third metal layer disposed on one side of the source-drain layer facing away from the substrate, wherein the third metal layer is provided with the first dummy wires extending along the first direction, and the first dummy wires are configured to receive the first reference voltage signal;

wherein an absolute value of the first reference voltage signal is greater than an absolute value of a second reference voltage signal.

11. The display panel of claim 10, wherein the source-drain layer is further provided with second reference voltage signal lines extending along the second direction and the second dummy wires extending along the second direction, and the second dummy wires in the source-drain layer are configured to receive the first reference voltage signal.

12. The display panel of claim 10, further comprising:

an insulating layer disposed on one side of the third metal layer facing away from the substrate; and a fourth metal layer disposed on one side of the insulating layer facing away from the substrate and, wherein the fourth metal layer is provided with the second dummy wires extending along the second direction;

wherein at least part of the second dummy wires in the fourth metal layer are configured to receive the first reference voltage signal.

13. The display panel of claim 12, wherein part of the second dummy wires in the fourth metal layer are configured to receive the second reference voltage signal; and in the fourth metal layer, the second dummy wires configured to receive the first reference voltage signal are insulated from the second dummy wires configured to receive the second reference voltage signal.

14. The display panel of claim 13, wherein in the fourth metal layer, a number of the second dummy wires configured to receive the first reference voltage signal is greater than a number of the second dummy wires configured to receive the second reference voltage signal.

15. The display panel of claim 11, wherein along the first direction, the second dummy wires and the second reference voltage signal lines extending along the second direction are alternately arranged;

along the second direction, the first dummy wires and the second reference voltage signal lines extending along the first direction are alternately arranged;

along the first direction, the sub-pixel regions in an i-th column and the sub-pixel regions in an (i+1)-th column share the first reference voltage signal outputted by the second dummy wires; and the sub-pixel regions in the (i+1)-th column and the sub-pixel regions in an (i+2)-th column share one of the second reference voltage signal lines, wherein $1 \leq i \leq N-2$, and N denotes a total number of columns in the sub-pixel regions.

16. The display panel of claim 11, wherein along the first direction, the second dummy wires and the second reference voltage signal lines extending along the second direction are alternately arranged;

along the second direction, the first dummy wires and the second reference voltage signal lines extending along the first direction are alternately arranged;

along the second direction, the sub-pixel regions in a p-th row share the first reference voltage signal outputted by the first dummy wires; and the sub-pixel regions in a (p+1)-th row share one of the second reference voltage signal lines, wherein 1≤p≤M−1, and M denotes a total number of rows in the sub-pixel regions.

17. The display panel of claim 1, comprising:
the substrate;
a first gate layer disposed on one side of the substrate and provided with a gate layer of a first thin-film transistor in one of the sub-pixel regions and a first plate of a storage capacitor;
an electrode plate layer disposed on one side of the first gate layer facing away from the substrate and provided with a second plate of the storage capacitor and reference voltage signal lines;
a source-drain layer disposed on one side of the electrode plate layer facing away from the substrate and provided with a source and a drain of the first thin-film transistor and reference voltage signal lines;
a first planarization layer disposed on one side of the source-drain layer facing away from the substrate;
a fifth metal layer disposed on one side of the first planarization layer facing away from the substrate and provided with the first dummy wires;
a second planarization layer disposed on one side of the fifth metal layer facing away from the substrate; and
a sixth metal layer disposed on one side of the second planarization layer facing away from the substrate and provided with the second dummy wires;
wherein the first dummy wires and the second dummy wires are configured to receive a third power signal.

18. The display panel of claim 17, wherein a second gate layer is further provided between the electrode plate layer and the source-drain layer;
wherein the second gate layer is provided with a gate layer of a second thin-film transistor in one of the sub-pixel regions, the first thin-film transistor is a p-type thin-film transistor, and the second thin-film transistor is an n-type thin-film transistor.

19. The display panel of claim 17, wherein the plurality of fan-out wires of the display region comprise third dummy wires extending along the first direction and fourth dummy wires extending along the second direction;
the third dummy wires and the first dummy wires are configured in a same layer, and the fourth dummy wires and the second dummy wires are configured in a same layer;
the third dummy wires and the fourth dummy wires are electrically connected through the second planarization layer; and
part of the plurality of fan-out wires extending to the non-display region are converted to the first gate layer or the electrode plate layer.

20. A display device, comprising a display panel, wherein the display panel comprises:
a substrate, a display region and a non-display region at least partially surrounding the display region;
wherein the display region comprises a plurality of scanning lines extending along a first direction and a plurality of data lines extending along a second direction, the first direction intersects with the second direction, and the plurality of scanning lines and the plurality of data lines intersect to define sub-pixel regions;

wherein the non-display region comprises a plurality of pads;
wherein the display panel further comprises: a fan-out region configured on one side of the display region closer to the plurality of pads, at least part of the fan-out region is disposed in the display region;
wherein the fan-out region is provided with a plurality of fan-out wires for connecting the plurality of data lines to corresponding pads, the display region comprises a plurality of dummy wires, wherein the plurality of dummy wires comprise first dummy wires extending along the first direction and second dummy wires extending along the second direction, the plurality of dummy wires are configured to receive at least one of the following signals: a first power signal, a second power signal, a first reference voltage signal, a second reference voltage signal, or a third power signal; and
wherein projections of the plurality of dummy wires in a plane parallel to the substrate form a grid structure, and the plurality of fan-out wires are insulated from the plurality of dummy wires.

21. A display panel, comprising: a substrate, a display region, and a non-display region at least partially surrounding the display region;
wherein the display region comprises a plurality of scanning lines extending along a first direction and a plurality of data lines extending along a second direction, the first direction intersects with the second direction, and the plurality of scanning lines and the plurality of data lines intersect to define sub-pixel regions;
wherein the non-display region comprises a plurality of pads;
wherein the display panel further comprises: a fan-out region configured on one side of the display region closer to the plurality of pads, at least part of the fan-out region is disposed in the display region;
wherein the fan-out region is provided with a plurality of fan-out wires for connecting the plurality of data lines to corresponding pads, the display region comprises a plurality of dummy wires, wherein the plurality of dummy wires comprise first dummy wires extending along the first direction and second dummy wires extending along the second direction,
wherein at least one of the following is satisfied:
the plurality of fan-out wires comprise third dummy wires extending along the first direction, the third dummy wires and the first dummy wires are configured in a same layer, and different signals are transmitted on the third dummy wires and the first dummy wires; or,
the plurality of fan-out wires comprise third dummy wires extending along the first direction and fourth dummy wires extending along the second direction, the third dummy wires and the first dummy wires are configured in a same layer, the fourth dummy wires and the second dummy wires are configured in a same layer, a same signal is transmitted on the third dummy wires and the fourth dummy wires and a same signal is transmitted on the first dummy wires and the second dummy wires; and
wherein projections of the plurality of dummy wires in a plane parallel to the substrate form a grid structure, and the plurality of fan-out wires are insulated from the plurality of dummy wires.

* * * * *